US012808044B2

(12) United States Patent
Mannhart et al.

(10) Patent No.: US 12,808,044 B2
(45) Date of Patent: Nov. 24, 2026

(54) METHOD OF FORMING A LAYER OF A COMPOUND

(71) Applicant: MAX-PLANCK-GESELLSCHAFT ZUR FÖRDERUNG DER WISSENSCHAFTEN E.V., Munich (DE)

(72) Inventors: Jochen Mannhart, Böblingen (DE); Dong Yeong Kim, Stuttgart (DE); Wolfgang Braun, Bietigheim-Bissingen (DE)

(73) Assignee: Max-Planck-Gesellschaft zur Förderung der Wissenschaften e. V., Munich (DE)

( * ) Notice: Subject to any disclaimer, the term of this patent is extended or adjusted under 35 U.S.C. 154(b) by 199 days.

(21) Appl. No.: 18/290,234

(22) PCT Filed: Jul. 1, 2021

(86) PCT No.: PCT/EP2021/068246

§ 371 (c)(1),
(2) Date: Nov. 10, 2023

(87) PCT Pub. No.: WO2023/274549

PCT Pub. Date: Jan. 5, 2023

(65) Prior Publication Data

US 2025/0290199 A1 Sep. 18, 2025

(51) Int. Cl.

*C23C 16/30* (2006.01)
*C23C 16/40* (2006.01)
*C23C 16/448* (2006.01)
*C23C 16/455* (2006.01)

(52) U.S. Cl.

CPC ........ *C23C 16/4488* (2013.01); *C23C 16/403* (2013.01); *C23C 16/405* (2013.01); *C23C 16/406* (2013.01); *C23C 16/407* (2013.01); *C23C 16/408* (2013.01); *C23C 16/45557* (2013.01)

(58) Field of Classification Search

CPC . C23C 16/4488; C23C 16/403; C23C 16/405; C23C 16/406; C23C 16/407; C23C 16/408; C23C 16/45557; C23C 16/30
See application file for complete search history.

(56) References Cited

U.S. PATENT DOCUMENTS 6,090,207 A * 7/2000 Knauss .................. C23C 14/28 204/298.18
6,258,170 B1 7/2001 Somekh et al.
2004/0023461 A1* 2/2004 Ahn .................. H01L 21/28185 438/785
2007/0039641 A1* 2/2007 Hu .................... H10N 10/8556 136/238
2007/0243328 A1 10/2007 Liu et al.
2008/0187684 A1* 8/2008 Hu .......................... C30B 29/16 427/596
2011/0175060 A1* 7/2011 Okai .................... H10D 62/882 977/734
2013/0203211 A1* 8/2013 Sittinger ............... H01L 21/768 438/609
2015/0092053 A1* 4/2015 Sullivan .................... F21V 9/06 351/44
2015/0280017 A1 10/2015 El Zein et al.
2017/0330973 A1* 11/2017 Yamazaki .......... B23K 26/0738
2018/0009061 A1* 1/2018 Sbetti ................. B23K 26/0665
2020/0400944 A1* 12/2020 Burnsed ................. H04N 23/11
2021/0355576 A1 11/2021 Braun

FOREIGN PATENT DOCUMENTS

CN 102569072 * 7/2012 ........... H01L 21/335
CN 103725858 * 4/2014 ............... C21D 7/06
CN 106249500 A * 12/2016 ............... G02F 1/15
CN 110491771 * 11/2019 ............. H01L 21/02
CN 110828831 * 2/2020 ............. H01M 4/86
DE 102018127262 A1 4/2020
EP 0808917 A1 11/1997
EP 3162764 * 2/2015 ............. C01G 45/12
EP 3808542 A1 * 4/2021 ........... B29C 64/393
JP 2-221197 * 9/1990 ............. C30B 29/48

(Continued)

OTHER PUBLICATIONS

Young, Steven R., et al., "Data mining for better material synthesis: The case of pulsed laser deposition of complex oxides". J. Appl. Phys. 123, 115303 (2018) pp. 1-11.*
English translation of JP 2004-103925.*
Meshcheryakov, Yuri P., et al., "Role of thermal stresses on pulsed laser irradiation of thin films under conditions of microbump formation and nonvaporization forward transfer". Appl Phys A (2013) 113:521-529.*
W. Braun and J. Mannhart, "Film deposition by thermal laser evaporation," AIP Adv. 9, 85310 (2019).
T. J. Smart, J. Mannhart, and W. Braun, "Thermal laser evaporation of elements from across the periodic table," J. Laser Appl. 33, 22008 (2021).

(Continued)

*Primary Examiner* — Bret P Chen
(74) *Attorney, Agent, or Firm* — Dickinson Wright PLLC

(57) ABSTRACT

A method of forming a layer of a compound having a thickness selected in the range of a monolayer to several mm on a substrate, such as a single crystal wafer, the substrate being arranged in a process chamber comprising one or more sources of source material. The method includes providing a reaction atmosphere in the process chamber, the reaction atmosphere comprising a process gas and a reaction chamber pressure, and irradiating the one or more sources with laser light to melt and/or sublimate and/or evaporate atoms and/or molecules of the source material present at a surface of the one or more sources. The method proceeds by reacting the melted and/or sublimated and/or evaporated atoms and/or molecules with the process gas, and then forming the layer of the compound on the substrate.

18 Claims, 20 Drawing Sheets

(56) References Cited

FOREIGN PATENT DOCUMENTS

Figure 1:
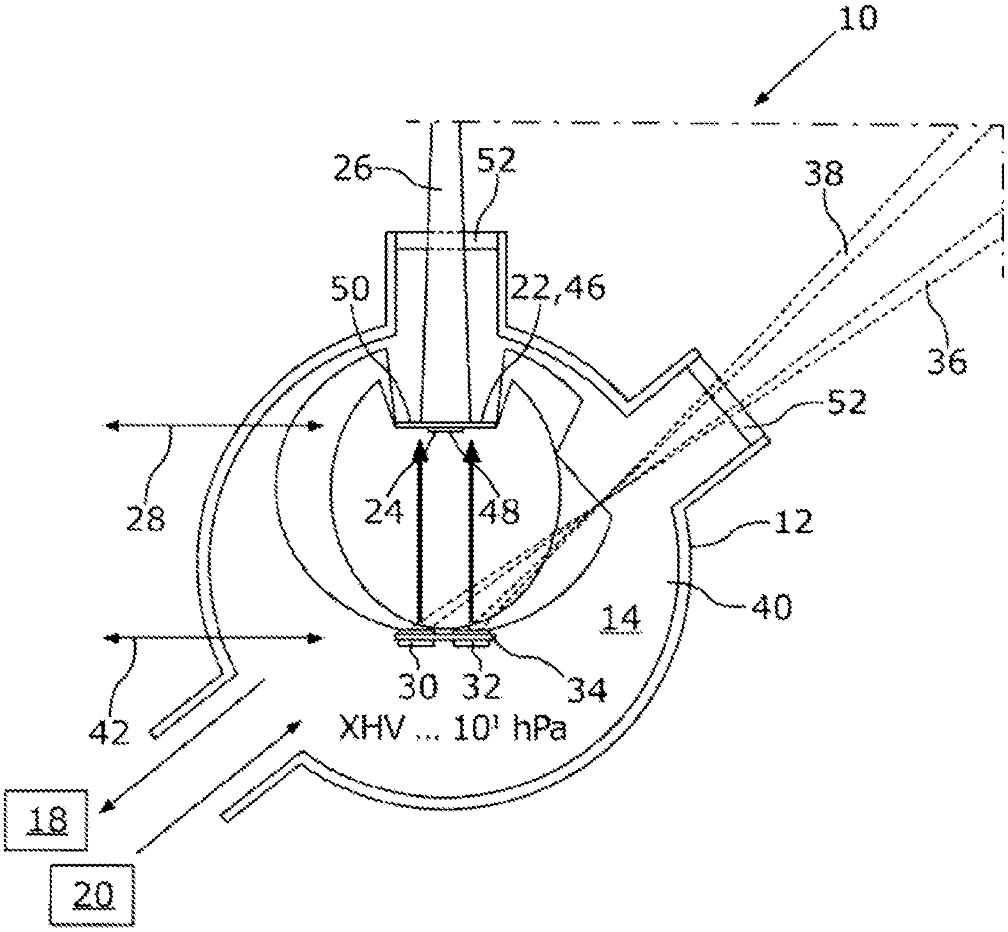

| | | | | | |
|---|---|---|---|---|---|
| JP | 2004-103925 | | * | 4/2004 | H01L 21/3065 |
| JP | 2004-292231 | | * | 10/2004 | C01B 31/02 |
| JP | 4011344 | | * | 9/2007 | H01L 21/20 |
| JP | 2007-288141 | A | | 11/2007 | |
| JP | 4565170 | B2 | * | 8/2010 | C01G 23/07 |
| JP | 2011-146190 | | * | 7/2011 | H01M 4/139 |
| JP | 2013-118402 | A | | 6/2013 | |
| JP | 2016-505476 | A | | 2/2016 | |
| WO | WO 03091156 | | * | 11/2003 | C01G 1/00 |
| WO | WO 2004/023194 | A2 | * | 3/2004 | G02F 1/00 |
| WO | WO 2019131640 | A1 | * | 4/2019 | G02B 5/22 |
| WO | 2020089180 | A1 | | 5/2020 | |

OTHER PUBLICATIONS

A. Y. Cho and J. R. Arthur, "Molecular beam epitaxy," Prog. Solid State Chem. 10, 157 (1975).

J. R. Arthur, "Molecular beam epitaxy," Surf. Sci. 500, 189 (2002).

A. Prakash, J. Dewey, H. Yun, J. S. Jeong, K. A. Mkhoyan, and B. Jalan, "Hybrid molecular beam epitaxy for the growth of stoichiometric BaSnO3," J. Vac. Sci. Tech. A 33, 60608 (2015).

M. Brahlek, A. S. Gupta, J. Lapano, J. Roth, H .- T. Zhang, L. Zhang, R. Haislmaier, and R. Engel-Herbert, "Frontiers in the growth of complex oxide thin films: past, present, and future of hybrid MBE," Adv. Funct. Mater. 28, 1702772 (2018).

T. Ohnishi, H. Koinuma, and M. Lippmaa, "Pulsed laser deposition of oxide thin films," Appl. Surf. Sci. 252, 2466 (2006).

H. M. Christen and G. Eres, "Recent advances in pulsed-laser deposition of complex oxides," J. Phys.: Condens. Matter 20, 264005 (2008).

H. M. Smith and A. F. Turner, "Vacuum deposited thin films using a Ruby laser," Appl. Opt. 4, 147 (1965).

G. Groh, "Vacuum deposition of thin films by means of a CO2 laser," J. Appl. Phys. 39, 5804 (1968).

V. S. Ban and D. A. Kramer, "Thin films of semiconductors and dielectrics produced by laser evaporation," J. Mater. Sci. 5, 978 (1970).

H. Sankur and R. Hall, "Thin-film deposition by laser-assisted evaporation," Appl. Opt. 24, 3343 (1985).

J. T. Cheung, G. Niizawa, J. Moyle, N. P. Ong, B. M. Paine, and T. Vreeland, "HgTe and CdTe epitaxial layers and HgTe-CdTe superlattices grown by laser molecular beam epitaxy," J. Vac. Sci. Technol. A 4, 2086 (1986).

J. T. Cheung, E.-H. Cirlin, and N. Otsuka, "Structure of nonrectangular HgCdTe superlattices grown by laser molecular beam epitaxy," Appl. Phys. Lett. 53, 310 (1988).

J. T. Cheung and H. Sankur, "Growth of thin films by laser-induced evaporation," Crit. Rev. Solid State Mater. Sci. 15, 63 (1988).

H. Amekura, O. A. Plaksin, K. Kono, Y. Takeda, and N. Kishimoto, "Production of Cu20 nanoparticles in SiO2 by ion implantation and two-step annealing at different oxygen pressures," J. Phys. D: Appl. Phys. 39, 3659 (2006).

P. B. Barna and M. Adamik, "Fundamental structure of forming phenomena of polycrystalline films and the structure zone models," Thin Solid Films 317, 27 (1998).

B. Agnarsson, F. Magnus, T. K. Tryggvason, A. S. Ingason, K. Leosson, S. Olafsson, and J. T. Gudmundsson, "Rutile TiO2 thin films grown by reactive high power impulse magnetron sputtering," Thin Solid Films 545, 445 (2013).

A. Prakash and B. Jalan, "Wide bandgap perovskite oxides with high room-temperature electron mobility," Adv. Mater. Interfaces 6, 1900479 (2019).

H. L. Johnston and A. L. Marshall, "Vapor pressure of nickel and nickel oxide," J. Am. Chem. Soc. 62, 1382 (1940).

M. W. Chase, Jr., NIST-JANAF Thermochemical Tables, 4th ed. (American Institute of Physics for the National Institute of Standards and Technology, Washington, DC, 1998).

S. Takayanagi, "Effect of oxygen pressure on the oxidation of tungsten powder," Trans. Jpn. Inst. Met. 3, 100 (1962).

Kim DY, Mannhart J, Braun W. "Thermal laser evaporation for the growth of oxide films." APL Materials. Aug. 1, 2021;9(8).

D. Hanaor and C. C. Sorrell, "Review of the anatase to rutile phase transformation," J. Mater. Sci. 46, 855 (2011).

Japanese Office Action dated Mar. 31, 2026 corresponding to Japanese Patent Application No. 2024-500013, 10 pages.

* cited by examiner

METHOD OF FORMING A LAYER OF A COMPOUND

CROSS-REFERENCES TO RELATED APPLICATIONS

This application is a 371 National Phase Application of International Application PCT/EP2021/068246, filed on Jul. 1, 2021. The entire disclosure of the application referenced above is incorporated herein by reference.

The present invention relates to a method of forming a layer of a compound having a thickness selected in the range of a monolayer to several mm on a substrate, such as a single crystal wafer, the substrate being arranged in a process chamber comprising one or more sources of source material. The invention further relates to a compound optionally obtained by this method.

The formation of layers, such as thin films, on substrates is well documented in the state of the art. However, the growth of thin films formed from compounds can only be carried out with a high level of impurities since compound sources used typically have a 3N (99.9%) level of purity.

For this reason it is an object of the invention to make available a method of forming compounds as thin layers in a reproducible and cost effective manner optionally with a significantly reduced number of impurities. It is a further object of the present invention to make available layers of compounds for application as quantum components.

This object is satisfied by a method according to claim 1.

Such a method of forming a layer of a compound having a thickness selected in the range of a monolayer to several mm on a substrate, such as a single crystal wafer, with the substrate being arranged in a process chamber comprising one or more sources of source material, may comprise the steps of:

- providing a reaction atmosphere in the process chamber, the reaction atmosphere comprising a pre-defined process gas and a reaction chamber pressure;
- irradiating the one or more sources with laser light in order to melt and/or sublimate and/or evaporate atoms and/or molecules of the source material present at least at a surface of the one or more sources;
- reacting the melted and/or sublimated and/or evaporated atoms and/or molecules with the process gas in the process chamber and
- forming the layer of the compound on the substrate.

The invention describes the synthesis of compounds, preferably oxides, by evaporation of solid or liquid elements in a gaseous environment. The elements are evaporated by thermal laser evaporation, and react with the gaseous environment either at the surface of the source, on their way to the substrate, or on the surface of the substrate. These reactions may enhance the deposition process.

The invention provides the provision of an elementary source which is essentially solid or liquid at the process temperature where only a small fraction of it evaporates or sublimates per time unit due to irradiation by a laser. At the same time, the process chamber is filled with a process gas that on purpose reacts with the evaporated or sublimated element to form a compound. This compound is then deposited as a thin film or epitaxial thin film on the substrate.

Process gas is defined as a substance which has a vapor pressure high enough not to condense anywhere in the process chamber under process conditions. Process conditions usually means room temperature and chamber pressures between $10^{-6}$ and $10^{1}$ hPa. Under these conditions, a substantial number of the atoms or molecules evaporated in the direction of the substrate arrive at the substrate. It has been found that for pressures at or below $10^{-2}$ hPa more than 50% of the atoms or molecules evaporated in the direction of the substrate also arrive at the substrate, i.e. the number of atoms or molecules arriving at the substrate is >50% for pressures up to $10^{-2}$ hPa and <50% of the atoms or molecules evaporated in the direction of the substrate arrive at the substrate for pressures higher than $10^{-2}$ and up to $10^{1}$ hPa.

At higher pressures of the reactive gas, the evaporated atoms or molecules suffer more collisions with the gas atoms, leading to a randomization of their direction and kinetic energies. This results in a much smaller fraction of the evaporated atoms or molecules reaching the substrate, which, however, may still be useful for forming a layer in some cases, in particular for short working distances and large substrates. The formation of the compound or oxide layer on the substrate under these conditions may take place under several conditions:

- growth mode 1: the source material reacts or oxidizes at the source surface and evaporates or sublimates as a compound or oxide. It then deposits as compound or oxide on the substrate.
- growth mode 2: the source material evaporates or sublimates without reaction, and reacts with the gas by collision with gas atoms on its trajectory from the source to the substrate and deposits as compound or oxide.
- growth mode 3: the source material evaporates or sublimates without reaction, travels without reaction, and reacts when or after it deposits on the substrate with gas atoms or molecules impinging on the substrate.
- growth mode 4: any combination of the above. Of particular interest is a transport reaction in which the source material reacts with the gas to form a metastable compound with a higher evaporation/sublimation rate than the source material itself. This material further reacts in the gas phase and deposits as the final compound, or deposits on the substrate and reacts with further gas to form the final, stable compound.

In the simplest case, one non-gaseous source element and one gaseous element are used in the process. The stoichiometry (ratio of the elements in the compound) may be controlled by the ratio of the flux to the gas pressure. In this manner, we are able to produce for example vanadium oxide films with various V-to-O ratios.

Several source materials and several gas partial pressures may be combined to form complex compounds consisting of more than two elements, in particular consisting of more than one source element, more than one gaseous element, and more than one of both. The ratio between the non-gaseous source elements in such a compound can be controlled by the relative fluxes between the sources via the laser powers for each evaporation laser. The ratio between the gaseous source elements in such a compound can be controlled by the relative partial pressures of the gases in the chamber.

We have experimentally demonstrated this process for the following elements and an oxygen/ozone mixture with approximately 10% ozone to deposit binary oxides. The numbers in brackets indicate the likely reaction mode from the above bullet list: Sc (1), Ti (1, 4), V (1), Cr (1, 4), Mn (1), Fe (1, 4), Co (1), Ni (1), Cu (3), Zn (1, 3), Zr (1), Nb (1, 4), Mo (1), Ru (1), Hf (1), Al (3,4). From the similarity in physical properties of the elements, we are very confident that the following elements can also be used to grow their binary oxides with the same process: Mg, Ca, Sr, Ba, Y, Rh, Ta, W, Re, Ir, Ga, In, Si, Ge, Sn, Eu, Ce. We are not sure whether the following elements may work, but there is a realistic chance: Pd, Ag, Pt, Au. The combination of more than one essentially solid or liquid element with more than one gas allows the formation of complex compounds. In such a reaction, the ratio of the essentially solid or liquid elements to each other is controlled by their relative flux densities, whereas the ratio of the gaseous elements to each other is controlled by their relative partial pressures, and the total ratio of essentially solid or liquid to gaseous elements is determined by the ratio of the total flux density to the total gas pressure.

Working with a non-condensing gas atmosphere has another major advantage not related to the process reaction itself. If the distance from the source to the laser entrance window is significantly larger than the distance from the source to the substrate, and if the gas (oxygen) pressure can be kept at the upper limit (full reaction or oxidation in the case of a reaction limited by the essentially solid or liquid element), the coating of the entrance window can be dramatically reduced.

This is due to the scattering of the non-gaseous source atoms or molecules with the atoms or molecules of the reaction gas. If the distances and pressures are set such that there are essentially no collisions between source and substrate, and many between source and laser entrance window, source atoms that would normally deposit as absorbing layers on the entrance window will either be scattered away, with a much smaller probability of reaching the entrance window than with direct line-of-sight trajectories. In addition, with multiple collisions they have a higher probability to react with the reaction gas to form a compound which (as is usually the case with oxides) may be transparent and non-absorbing to the source heating laser wavelength. Even with non-reacted source material reaching the laser entrance window, it may there react to the oxide after being deposited, again forming a transparent, essentially non-absorbing layer. This effect may even be large enough such that the shielding aperture may be omitted, thereby simplifying both the complexity of the deposition chamber and its operation.

The one or more sources are irradiated with laser light on a surface of the one or more sources directly facing the substrate.

The one or more sources are irradiated with continuous laser light. In this way a uniform evaporation and/or sublimation of the material of the source can be achieved.

The reaction chamber pressure may be selected in the range of $10^{-6}$ to $10^{1}$ hPa, in particular in the range of $10^{-4}$ to $10^{1}$, especially in the range of $10^{-4}$ to $10^{-2}$ hPa. In this way ultra-pure layers with as few defects as possible can be created on the one hand, or simple coatings with more defects, but with lower cost and higher deposition rate where the purity is not required, on the other hand.

In this context it should also be noted that Oxide-MBE is typically carried out at pressures lower than $10^{-6}$ hPA and hence works in a completely different pressure region in comparison to the present invention.

The step of providing a reaction atmosphere may comprise an evacuation of the process chamber to a first pressure and then introducing the process gas to obtain a second pressure, the reaction chamber pressure in the reaction chamber. In this way the substrate may be degassed prior to the introduction of the laser light and process G into the reaction chamber for the formation of the compound. In this way, detrimental elements contained in the background gas pressure of the chamber prior to the process may be pumped out to a very high degree (many orders of magnitude) and thereby prevented from incorporating into the deposited layers or onto the surface of the epitaxial template.

The first pressure may be lower than the second pressure in order to from coatings of high quality that are as defect free as possible.

The second pressure may be selected in the range of $10^{-11}$ to $10^{-2}$ hPa. In this way the desired layers of compounds can be formed, with different stoichiometries of the non-gaseous and the gaseous constituent depending on the second pressure.

In this connection it should be noted that MBE applications and electron beam applications cease working at such high pressures, i.e. at pressures above 10-7 hPa, A temperature of at least the shroud of the reaction chamber and/or of an inner wall of the reaction chamber may be temperature controlled to a temperature selected in the range of 77 K to 500 K.

In this way it is possible to heat the process chamber to temperatures up to 200° C., allowing the use of materials which would condense to the chamber walls at room temperature. The process chamber may also have a liquid nitrogen cooled shroud to freeze out unwanted impurities, in which case the process conditions imply a process chamber temperature (at least of the shroud) of down to 77 K.

The source material may be a material that is solid or liquid in the reaction atmosphere, i.e. at the temperatures and pressures and the gaseous environment present in the reaction chamber.

The reaction chamber may be held at elevated temperature to avoid condensation of the gas. The gas may also be used to reduce or avoid laser entrance window coating.

The process gas may be selected from the group of members consisting of oxygen (O), ozone ($O_3$), plasma-activated oxygen (O), nitrogen (N), plasma-activated nitrogen (N), hydrogen (H), fluorine (F), chlorine (CI), bromine (Br), iodine (I), phosphorus (P), sulphur(S), selenium (Se), mercury (Hg), $NH_3$, $N_2O$, $CH_4$ and combinations of the foregoing.

In this way compounds, such as oxides, nitrides, hydrides, fluorides, chlorides, bromides, iodides, phosphides, sulphides, selenides or mercury based compounds can be beneficially produced.

The source material is selected from the group of members consisting of Sc, Ti, V, Cr, Mn, Fe, Co, Ni, Cu, Zn, Zr, Nb, Mo, Ru, Hf, Al, Mg, Ca, Sr, Ba, Y, Rh, Ta, W, Re, Ir, Ga, In, Si, Ge, Sn, Eu, Ce, Pd, Ag, Pt, Au, alloys of the foregoing and combinations of the foregoing. In this way a plethora of different kinds of compounds can be formed in the reaction chamber.

The laser light that may irradiate the one or more sources with laser light in order to sublimate and/or evaporate atoms and/or molecules of the source material is focused at the one or more sources with an intensity selected in the range of 1 to 2000 W for a spot size of 1 $mm^2$ and a distance between the one or more sources and the substrate selected in the range of 50 to 120 mm. Such lasers are commercially available at comparatively low cost and can be operated in a simple and efficient way.

It has been found that the process scales while keeping the reaction conditions the same by increasing the laser power and the irradiated area on the source by the same ratio, e.g. irradiating a 4 $mm^2$ area with 2 KW of laser radiation will yield the same process conditions as irradiating a 1 $mm^2$ area with 500 W. In the same way, the four times larger total flux generated in the first case allows the deposition of the same layer thickness on a substrate twice as far away with four times the area, or with four times the deposition rate at the same distance. These scaling considerations apply as long as the mean free path, which is the average distance between collisions of source material atoms or molecules and gas atoms when traveling from the source to the substrate, scales by the same factor as the linear dimensions, in this illustrative example by a factor of 2.

The given process conditions are therefore intended to specify a power density which is independent of the scaling of the process, allowing such scaling as required by the intended area of deposition.

Likewise, the deposition rate has been found to scale from practically zero at very low laser powers to values that may dramatically exceed the standard values given. An upper limit of the growth rate, or power density values possible with the method could not yet be determined.

Sources subjected to such electromagnetic radiation may have a liquid surface exposed thereon at the location of the laser irradiation which forms a melt pool. This leads to stable and uniform evaporation due to the smooth and flat surface from which the atoms and molecules evaporate, and therefore superior layer characteristics in terms of thickness, composition, and process control.

The laser light irradiating the one or more sources with laser light has a wavelength in the range of 100 nm to 20 μm, especially in the range of 450 nm to 1.2 μm. From known material properties of the elements, laser wavelengths in the range from 200 to 400 nm should ideally be used; however lasers at this wavelength with high enough powers at an economical price do not yet exist, while lasers at around 515 nm and between 900 and 1100 nm are readily available at low cost per kW. Such wavelengths are found to bring about the desired evaporation and/or sublimation of the material of the one or more sources.

According to one example, the source material may be Ti and the compound deposited on the substrate may predominantly be anatase or rutile $TiO_2$, the laser light has a wavelength selected in the range of 515 to 1070 nm, in particular in the range of 1000 to 1070 nm, with an intensity in the range of 1 to 2000 W corresponding to a power density of 0.001 to 2 $KW/mm^2$ on the source surface, in particular in the range of 100 to 200 W corresponding to a power density of 0.1 to 0.2 $kW/mm^2$, a process gas being a mixture of $O_2$ and $O_3$, in particular with an $O_3$ content of 5 to 10 weight %, with a reaction chamber pressure of $10^{-11}$ to 1 hPa, in particular of $10^{-6}$ to $10^{-2}$ hPa, and a compound layer thickness selected in the range of 0 to 1 μm obtainable within a time period of 0 to 180 min, especially 700 nm within a time period of 15 to 30 min with a working distance of 10 mm to 1 m, in particular 40 to 80 mm and a substrate diameter of 5 to 300 mm, in particular 51 mm.

According to one example, the source material may be Ni, the compound deposited on the substrate may predominantly be NiO, the laser light has a wavelength selected in the range of 515 to 1070 nm, in particular in the range of 1000 to 1070 nm, with an intensity in the range of 1 to 2000 W corresponding to a power density of 0.001 to 2 $KW/mm^2$ on the source surface, in particular in the range of 100 to 350 W corresponding to a power density of 0.1 to 0.35 $KW/mm^2$, a process gas being a mixture of $O_2$ and $O_3$, in particular with an $O_3$ content of 5 to 10 weight %, with a reaction chamber pressure of $10^{-11}$ to 1 hPa, in particular of $10^{-6}$ to $10^{-2}$ hPa, and a compound layer thickness selected in the range of 0 to 1 μm obtainable within a time period of 0 to 50 min, especially 500 nm within a time period of 10 to min with a working distance of 10 mm to 1 m, in particular 40 to 80 mm and a substrate diameter of 5 to 300 mm, in particular 51 mm.

According to a further example, the source material may be Co, the compound deposited on the substrate may predominantly be $Co_3O_4$, the laser light has a wavelength selected in the range of 515 to 1070 nm, in particular in the range of 1000 to 1070 nm, with an intensity in the range of 1 to 2000 W corresponding to a power density of 0.001 to 2 $KW/mm^2$ on the source surface, in particular in the range of 100 to 200 W corresponding to a power density of 0.1 to 0.2 $KW/mm^2$, a process gas being a mixture of $O_2$ and $O_3$, in particular with an $O_3$ content of 5 to weight %, with a reaction chamber pressure of $10^{-11}$ to 1 hPa, in particular of $10^{-6}$ to $10^{-2}$ hPa, and a compound layer thickness selected in the range of 0 to 1 μm obtainable within a time period of 0 to 90 min, especially 200 nm within a time period of 10 to 20 min with a working distance of 10 mm to 1 m, in particular 40 to 80 mm and a substrate diameter of 5 to 300 mm, in particular 51 mm.

According to one example, the source material may be Fe, the compound deposited on the substrate may be predominantly $Fe_3O_4$, the laser light has a wavelength selected in the range of 515 to 1070 nm, in particular in the range of 1000 to 1070 nm, with an intensity in the range of 1 to 2000 W corresponding to a power density of 0.001 to 2 $KW/mm^2$ on the source surface, in particular in the range of 100 to 200 W corresponding to a power density of 0.1 to 0.2 $kW/mm^2$, a process gas being a mixture of $O_2$ and $O_3$, in particular with an $O_3$ content of 5 to 10 weight %, with a reaction chamber pressure of $10^{-11}$ to 1 hPa, in particular of $10^{-6}$ to $10^{-2}$ hPa, and a compound layer thickness selected in the range of 0 to 10 μm obtainable within a time period of 0 to 30 min, especially of 5 μm within a time period of 10 to 20 min with a working distance of 10 mm to 1 m, in particular 40 to 80 mm and a substrate diameter of 5 to 300 mm, in particular 51 mm.

According to one example, the source material may be Cu, the compound deposited on the substrate may be predominantly CuO, the laser light has a wavelength selected in the range of 515 to 1070 nm, in particular in the range of 1000 to 1070 nm, with an intensity in the range of 1 to 2000 W corresponding to a power density of 0.001 to 2 $KW/mm^2$ on the source surface, in particular in the range of 200 to 400 W corresponding to a power density of 0.2 to 0.4 $KW/mm^2$, a process gas being a mixture of $O_2$ and $O_3$, in particular with an $O_3$ content of 5 to 10 weight %, with a reaction chamber pressure of $10^{-11}$ to 1 hPa, in particular of $10^{-6}$ to $10^{-2}$ hPa, and a compound layer thickness selected in the range of 0 to 1 μm obtainable within a time period of 0 to 100 min, especially of 0.15 μm within a time period of to 30 min with a working distance of 10 mm to 1 m, in particular 40 to 80 mm and a substrate diameter of 5 to 300 mm, in particular 51 mm.

According to one example, the source material may be V, the compound deposited on the substrate may be predominantly either $V_2O_3$, $VO_2$ or $V_2O_5$, the laser light has a wavelength selected in the range of 515 to 1100 nm, in particular in the range of 1000 to 1100 nm, with an intensity in the range of 1 to 2000 W corresponding to a power density of 0.001 to 2 $kW/mm^2$ on the source surface, in particular in the range of 60 to 120 W corresponding to a power density of 0.06 to 0.12 $kW/mm^2$, a process gas being a mixture of $O_2$ and $O_3$, in particular with an $O_3$ content of 5 to 10 weight %, with a reaction chamber pressure of $10^{-11}$ to 1 hPa, in particular of $10^{-6}$ to $10^{-2}$ hPa, and a compound layer thickness selected in the range of 0 to 1 μm obtainable within a time period of 0 to 60 min, especially of 0.3 μm within a time period of 10 to 20 min with a working distance of 10 mm to 1 m, in particular 40 to 80 mm and a substrate diameter of 5 to 300 mm, in particular 51 mm.

According to one example, the source material may be Nb, the compound deposited on the substrate may be predominantly $Nb_2O_5$, the laser light has a wavelength selected in the range of 515 to 1100 nm, in particular in the range of 1000 to 1100 nm, with an intensity in the range of 1 to 2000 W corresponding to a power density of 0.001 to 2 $KW/mm^2$ on the source surface, in particular in the range of 200 to 400 W corresponding to a power density of 0.2 to 0.4 $KW/mm^2$, a process gas being a mixture of $O_2$ and $O_3$, in particular with an $O_3$ content of 5 to 10 weight %, with a reaction chamber pressure of $10^{-11}$ to 1 hPa, in particular of $10^{-6}$ to $10^{-2}$ hPa, and a compound layer thickness selected in the range of 0 to 2 μm obtainable within a time period of 0 to 20 min, especially of 1.4 μm within a time period of to 20 min with a working distance of 10 mm to 1 m, in particular 40 to 80 mm and a substrate diameter of 5 to 300 mm, in particular 51 mm.

According to one example, the source material may be Cr, the compound deposited on the substrate may be predominantly $Cr_2O_3$, the laser light has a wavelength selected in the range of 515 to 1100 nm, in particular in the range of 1000 to 1100 nm, with an intensity in the range of 1 to 2000 W corresponding to a power density of 0.001 to 2 $KW/mm^2$ on the source surface, in particular in the range of 20 to 80 W corresponding to a power density of 0.02 to 0.08 $KW/mm^2$, a process gas being a mixture of $O_2$ and $O_3$, in particular with an $O_3$ content of 5 to 10 weight %, with a reaction chamber pressure of $10^{-11}$ to 1 hPa, in particular of $10^{-6}$ to $10^{-2}$ hPa, and a compound layer thickness selected in the range of 0 to 1 μm obtainable within a time period of 0 to 30 min, especially of 0.5 μm within a time period of 10 to 20 min with a working distance of 10 mm to 1 m, in particular 40 to 80 mm and a substrate diameter of 5 to 300 mm, in particular 51 mm.

According to one example, the source material may be Ru, the compound deposited on the substrate may be predominantly $RuO_2$, the laser light has a wavelength selected in the range of 515 to 1100 nm, in particular in the range of 1000 to 1100 nm, with an intensity in the range of 1 to 2000 W corresponding to a power density of 0.001 to 2 $KW/mm^2$ on the source surface, in particular in the range of 200 to 600 W corresponding to a power density of 0.2 to 0.6 $kW/mm^2$, a process gas being a mixture of $O_2$ and $O_3$, in particular with an $O_3$ content of 5 to 10 weight %, with a reaction chamber pressure of $10^{-11}$ to 1 hPa, in particular of $10^{-6}$ to $10^{-2}$ hPa, and a compound layer thickness selected in the range of 0 to 1 μm obtainable within a time period of 0 to 300 min, especially of 0.06 μm within a time period of to 20 min with a working distance of 10 mm to 1 m, in particular 40 to 80 mm and a substrate diameter of 5 to 300 mm, in particular 51 mm.

According to one example, the source material may be Zn, the compound deposited on the substrate may be predominantly ZnO, the laser light has a wavelength selected in the range of 515 to 1100 nm, in particular in the range of 1000 to 1100 nm, with an intensity in the range of 1 to 2000 W corresponding to a power density of 0.001 to 2 $KW/mm^2$ on the source surface, in particular in the range of 5 to 10 W corresponding to a power density of 0.005 to 0.010 $KW/mm^2$, a process gas being a mixture of $O_2$ and $O_3$, in particular with an $O_3$ content of 5 to 10 weight %, with a reaction chamber pressure of $10^{-11}$ to 1 hPa, in particular of $10^{-6}$ to $10^{-2}$ hPa, and a compound layer thickness selected in the range of 0 to 1 μm obtainable within a time period of 0 to 20 min, especially of 1.4 μm within a time period of 10 to 20 min with a working distance of 10 mm to 1 m, in particular 40 to 80 mm and a substrate diameter of 5 to 300 mm, in particular 51 mm.

According to one example, the source material may be Mn, the compound deposited on the substrate may be predominantly MnO, the laser light has a wavelength selected in the range of 515 to 1100 nm, in particular in the range of 1000 to 1100 nm, with an intensity in the range of 1 to 2000 W corresponding to a power density of 0.001 to 2 $KW/mm^2$ on the source surface, in particular in the range of 5 to 10 W corresponding to a power density of 0.005 to 0.010 $KW/mm^2$, a process gas being a mixture of $O_2$ and $O_3$, in particular with an $O_3$ content of 5 to 10 weight %, with a reaction chamber pressure of $10^{-11}$ to 1 hPa, in particular of $10^{-6}$ to $10^{-2}$ hPa, and a compound layer thickness selected in the range of 0 to 1 μm obtainable within a time period of 0 to 20 min, especially of 1.4 μm within a time period of 10 to 20 min with a working distance of 10 mm to 1 m, in particular 40 to 80 mm and a substrate diameter of 5 to 300 mm, in particular 51 mm.

According to one example, the source material may be Sc, the compound deposited on the substrate may be predominantly $Sc_2O_3$, the laser light has a wavelength selected in the range of 515 to 1100 nm, in particular in the range of 1000 to 1100 nm, with an intensity in the range of 1 to 2000 W corresponding to a power density of 0.001 to 2 $KW/mm^2$ on the source surface, in particular in the range of to 50 W corresponding to a power density of 0.02 to 0.05 $KW/mm^2$, a process gas being a mixture of $O_2$ and $O_3$, in particular with an $O_3$ content of 5 to 10 weight %, with a reaction chamber pressure of $10^{-11}$ to 1 hPa, in particular of $10^{-6}$ to $10^{-2}$ hPa, and a compound layer thickness selected in the range of 0 to 1 μm obtainable within a time period of 0 to 20 min, especially of 1.3 μm within a time period of to 20 min with a working distance of 10 mm to 1 m, in particular 40 to 80 mm and a substrate diameter of 5 to 300 mm, in particular 51 mm.

According to one example, the source material may be Mo, the compound deposited on the substrate may be predominantly either $Mo_4O_{11}$ or $MoO_3$, the laser light has a wavelength selected in the range of 515 to 1100 nm, in particular in the range of 1000 to 1100 nm, with an intensity in the range of 1 to 2000 W corresponding to a power density of 0.001 to 2 $KW/mm^2$ on the source surface, in particular in the range of 400 to 800 W corresponding to a power density of 0.4 to 0.8 $KW/mm^2$, a process gas being a mixture of $O_2$ and $O_3$, in particular with an $O_3$ content of 5 to 10 weight %, with a reaction chamber pressure of $10^{-11}$ to 1 hPa, in particular of $10^{-6}$ to $10^{-2}$ hPa, and a compound layer thickness selected in the range of 0 to 4 μm obtainable within a time period of 0 to 30 min, especially of 4.0 μm within a time period of 10 to 20 min with a working distance of 10 mm to 1 m, in particular 40 to 80 mm and a substrate diameter of 5 to 300 mm, in particular 51 mm.

According to one example, the source material may be Zr, the compound deposited on the substrate may be predominantly $ZrO_2$, the laser light has a wavelength selected in the range of 515 to 1100 nm, in particular in the range of 1000 to 1100 nm, with an intensity in the range of 1 to 2000 W corresponding to a power density of 0.001 to 2 $KW/mm^2$ on the source surface, in particular in the range of 300 to 500 W corresponding to a power density of 0.3 to 0.5 $kW/mm^2$, a process gas being a mixture of $O_2$ and $O_3$, in particular with an $O_3$ content of 5 to 10 weight %, with a reaction chamber pressure of $10^{-11}$ to 1 hPa, in particular of $10^{-6}$ to $10^{-2}$ hPa, and a compound layer thickness selected in the range of 0 to 1 μm obtainable within a time period of 0 to 100 min, especially of 0.2 μm within a time period of 15 to 25 min with a working distance of 10 mm to 1 m, in particular 40 to 80 mm and a substrate diameter of 5 to 300 mm, in particular 51 mm.

According to one example, the source material may be Hf, the compound deposited on the substrate may be predominantly $HfO_2$, the laser light has a wavelength selected in the range of 515 to 1100 nm, in particular in the range of 1000 to 1100 nm, with an intensity in the range of 1 to 2000 W corresponding to a power density of 0.001 to 2 $kW/mm^2$ on the source surface, in particular in the range of 250 to 400 W corresponding to a power density of 0.25 to 0.4 $KW/mm^2$, a process gas being a mixture of $O_2$ and $O_3$, in particular with an $O_3$ content of 5 to 10 weight %, with a reaction chamber pressure of $10^{-11}$ to 1 hPa, in particular of $10^{-6}$ to $10^{-2}$ hPa, and a compound layer thickness selected in the range of 0 to 1 μm obtainable within a time period of 0 to 40 min, especially of 0.6 μm within a time period of 15 to 25 min with a working distance of 10 mm to 1 m, in particular 40 to 80 mm and a substrate diameter of 5 to 300 mm, in particular 51 mm.

According to one example, the source material may be Al, the compound deposited on the substrate may be aluminium oxide or predominantly $Al_2O_3$, the laser light has a wavelength selected in the range of 515 to 1100 nm, in particular in the range of 1000 to 1100 nm, with an intensity in the range of 1 to 2000 W corresponding to a power density of 0.001 to 2 $KW/mm^2$ on the source surface, in particular in the range of 200 to 400 W corresponding to a power density of 0.2 to 0.4 $kW/mm^2$, a process gas being a mixture of $O_2$ and $O_3$, in particular with an $O_3$ content of 5 to 10 weight %, with a reaction chamber pressure of $10^{-11}$ to 1 hPa, in particular of $10^{-6}$ to $10^{-2}$ hPa, and a compound layer thickness selected in the range of 0 to 1 μm obtainable within a time period of 0 to 20 min, especially of 1.0 μm within a time period of 15 to 25 min with a working distance of 10 mm to 1 m, in particular 40 to 80 mm and a substrate diameter of 5 to 300 mm, in particular 51 mm.

For Al, higher growth rates of more than 1 μm per minute are achievable due to growth mode 4, i.e. with the process gas reacting with the source material, at the source, on the passage between the source and the substrate and at the substrate with laser powers of 300 to 500 W at high oxygen/ozone partial pressures above $10^{-5}$ hPa.

Layers produced in this way have the specific advantage of being ultrapure, since the source materials as elemental metals can be obtained with very high purity. They can be deposited directly after the substrate has been prepared in the same ultrapure vacuum environment with high temperatures, which provides an extremely clean and structurally highly perfect template for epitaxy and therefore produces low densities of defects at the interface and therefore in the layer. Epitaxial layers can be grown both with highly accurate thicknesses at low growth rates or with large thicknesses at high growth rates. Using variable substrate temperatures, the layers can be deposited very close to thermal equilibrium, even with a sticking coefficient below unity by using high substrate temperatures and/or low growth rates, or very far away from it by using low substrate temperatures and/or very high growth rates. By exchanging the sources, as is evident from the numbers given above, many different oxides can be synthesized from many different metallic elemental sources with only small changes in the operating parameters, in particular with the same laser and optical path.

Simple or complex oxide layers can have many interesting properties such as ferroeletricity, superconductivity, semiconductivity, metallic conduction, multiferroicity and magnetism. The provision of the above oxide layers may make devices having such properties possible, particular as quantum components such as qubits.

The step of irradiating the one or more sources with laser light may at least melt the surface of the one or more sources. In this way the atoms or molecules of the source material can be released from the source in a more simple manner.

It should be noted in this context that in MBE, the source is heated from behind and hence one cannot simply heat the source such that only the surface and the underlying part of the source is melted, as the introduction of energy would cause the complete source to melt and hence be destroyed.

The step of irradiating the one or more sources with laser light source may facilitate the reaction with the process gas. By supplying energy to the one or more sources the atoms or molecules of the source material these can be released from the source in a more simple manner.

According to a further aspect the present invention relates to a compound having a thickness selected in the range of a monolayer to 10 μm on a substrate, in particular in the range of a monolayer to 100 nm, the compound being obtainable by a method described herein.

According to a further aspect the present invention relates to a compound present as a layer on a substrate, the layer having a thickness selected in the range of a monolayer to 100 nm on a substrate, the compound having qubit relaxation times and qubit coherence times above 100 μs, preferably above 1000 μs, even more preferably above 10 ms and less than 1000 ms.

Figure 2:
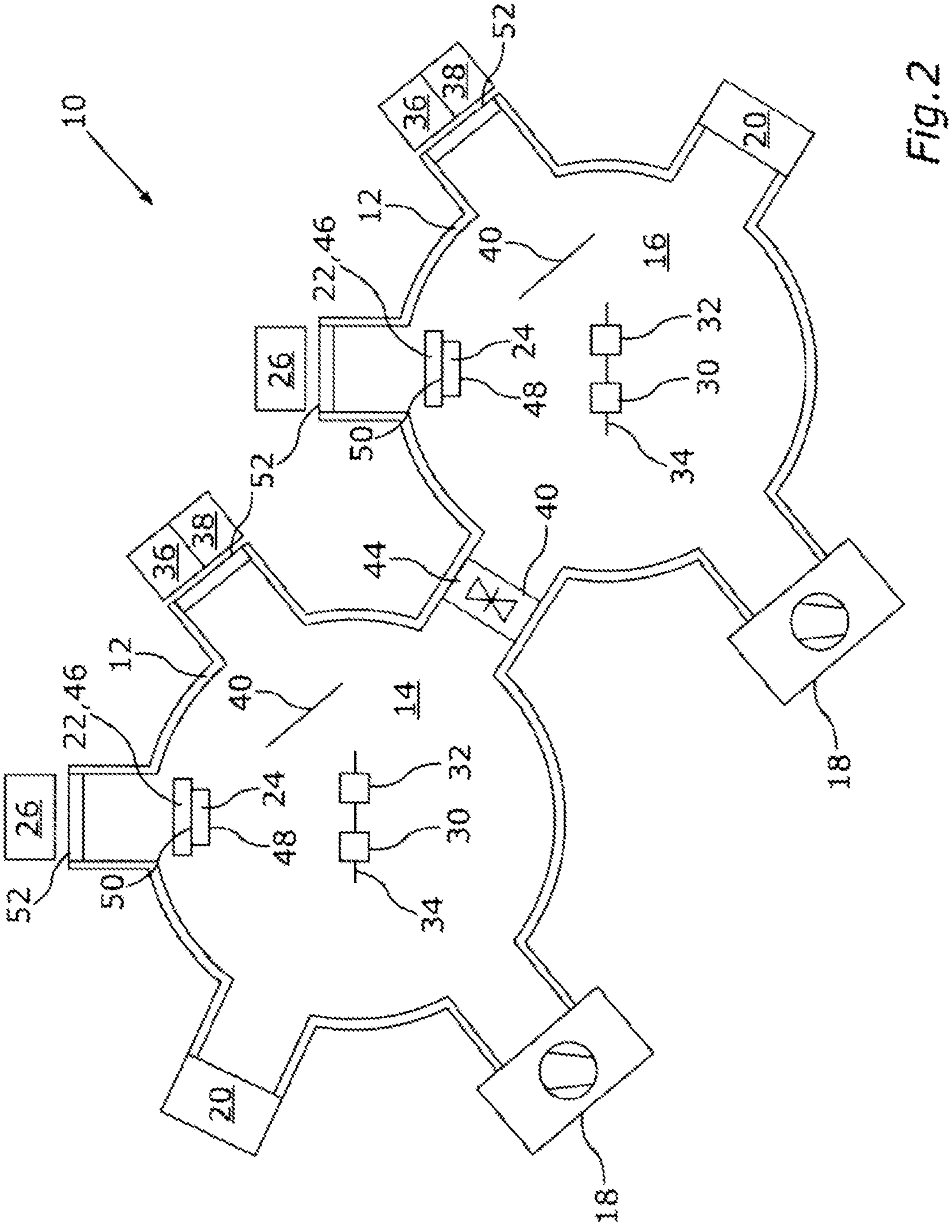
Figure 3:
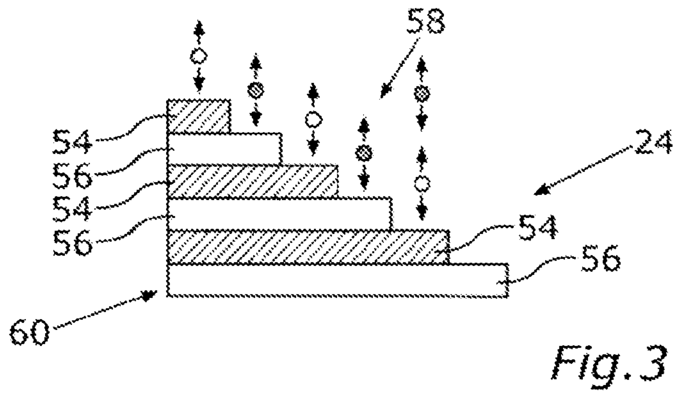
Figure 4:
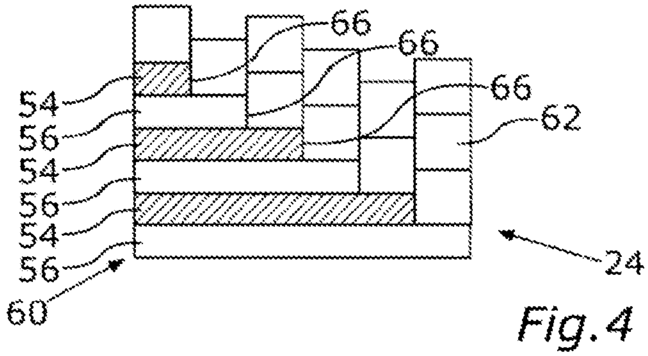
Figure 5:
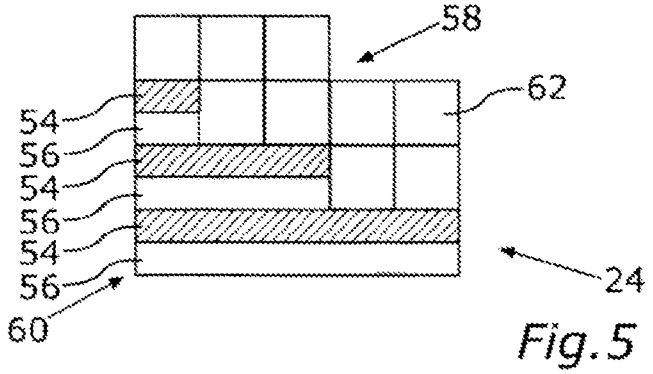
Figure 6:
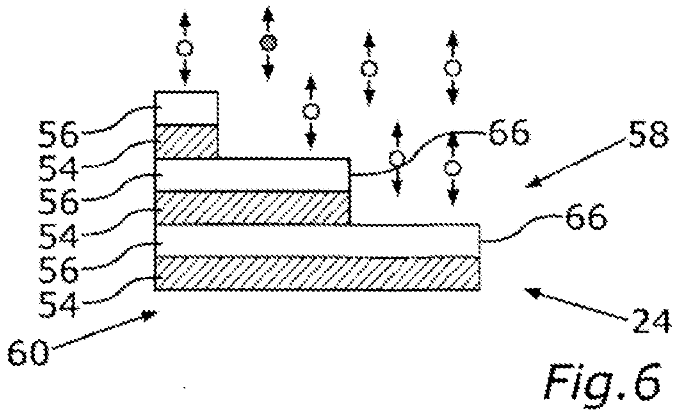
Figure 7:
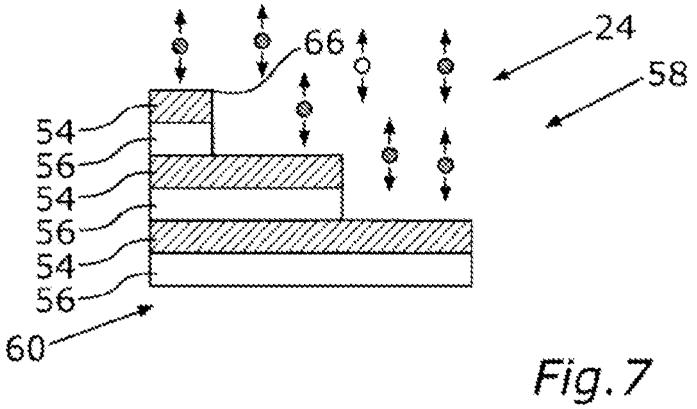
Figure 8:
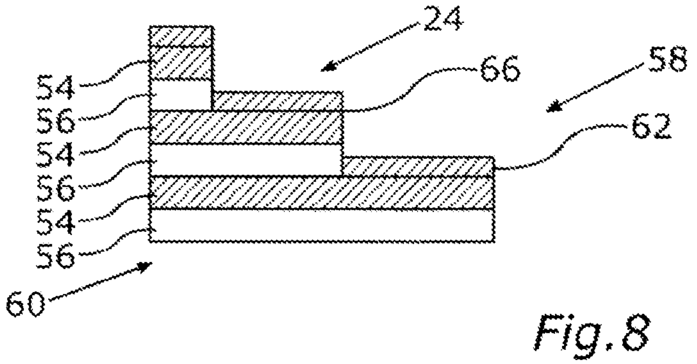
Figure 9:
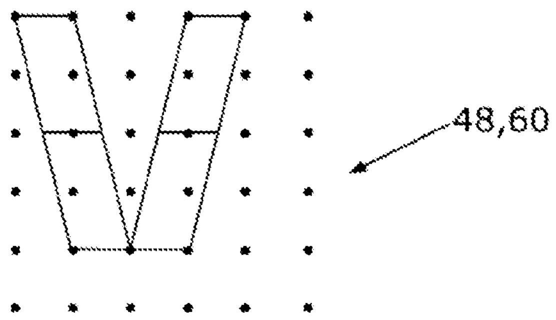
Figure 10:
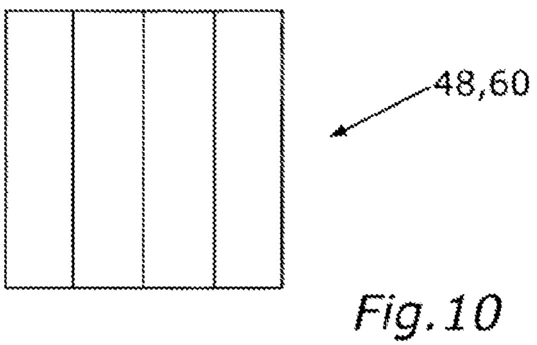
Figure 11:
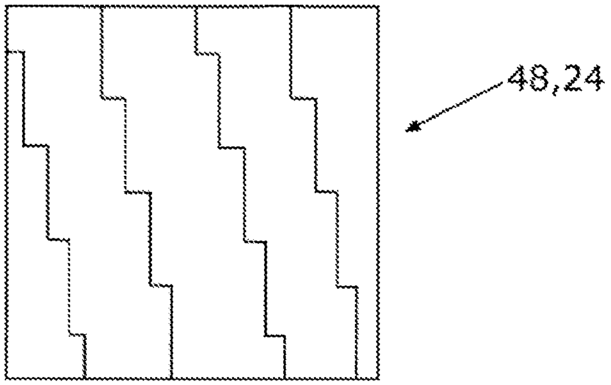
Figure 12:
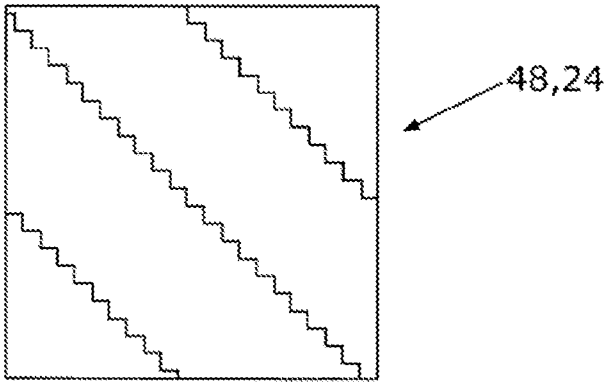
Figure 13:
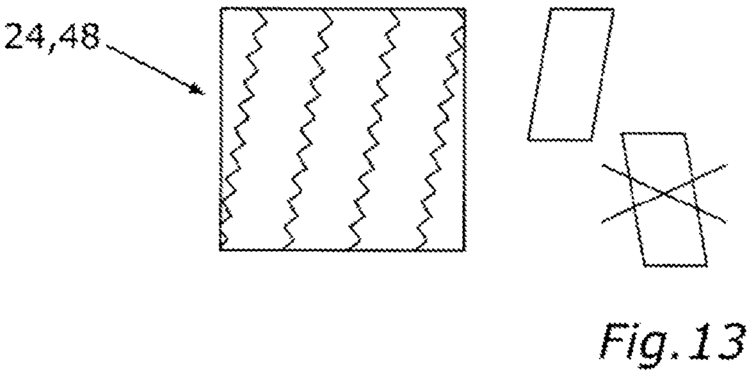
Figure 14:
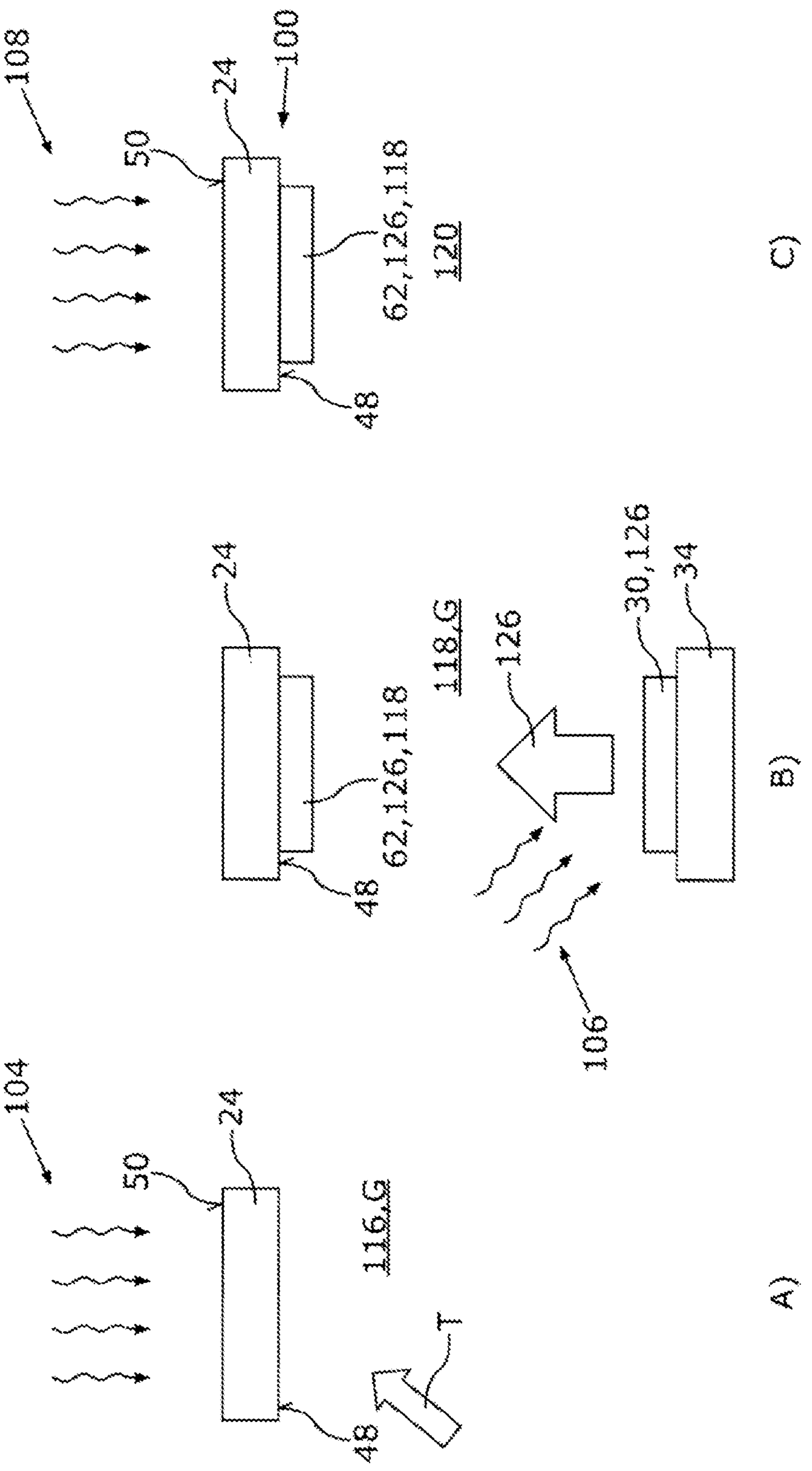
Figure 16:
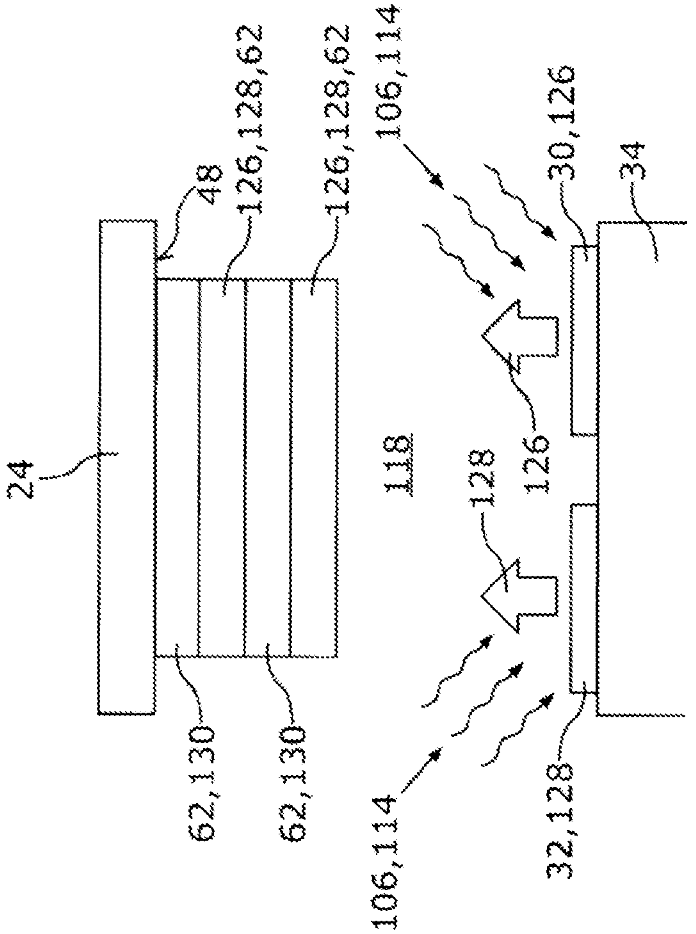
Figure 15:
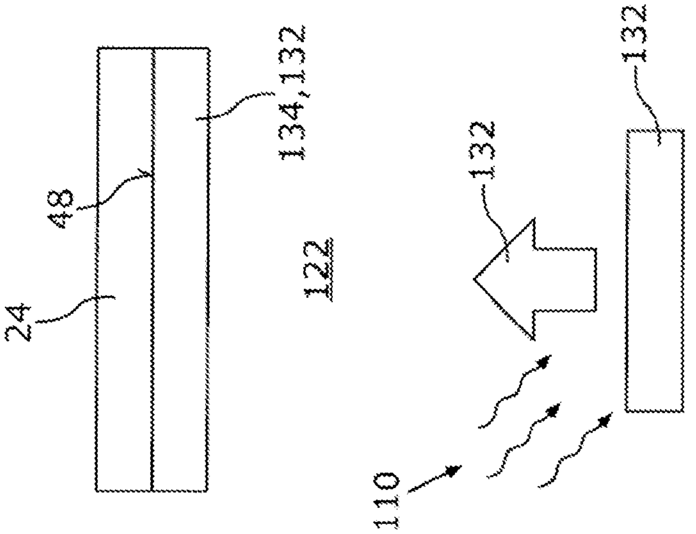

The invention will be explained in detail in the following by means of embodiments and with reference to the drawing in which is shown:

FIG. 1 a reaction chamber for thermal laser epitaxy applications comprising a single vacuum chamber;

FIG. 2 a reaction chamber for thermal laser epitaxy applications comprising first and second vacuum chambers defining first and second reaction volumes;

FIG. 3 cross-section of a stepped surface of a complex single crystalline solid, black and white denote different atomic or molecular species;

FIG. 4 faulty epitaxy due to mismatch of step heights or surface chemistry of a surface of a substrate;

FIG. 5 epitaxy in registry with the step height corresponding to the bulk periodicity of the surface of a substrate;

FIG. 6 crystal surface with 'white' termination;

FIG. 7 crystal surface with 'black' termination;

FIG. 8 surface reconstruction shown schematically as a fractional additional coverage of 'black' material;

FIG. 9 two mirror symmetric unit cells of a surface reconstruction;

FIG. 10 terraced step system perfectly aligned with the underlying crystal structure;

FIG. 11 miscut directed slightly away from the cubic in-plane crystal axes (horizontal and vertical in the figure);

FIG. 12 miscut directed 45° away from the in-plane axes;

FIG. 13 using symmetry breaking by surface miscut to favor one of two possible surface unit cell orientations;

FIG. 14 basic steps of producing a solid-state component;

FIG. 15 additional step of adding a buffer layer;

FIG. 16 depositing a thin film with two material sources

Figure 17:
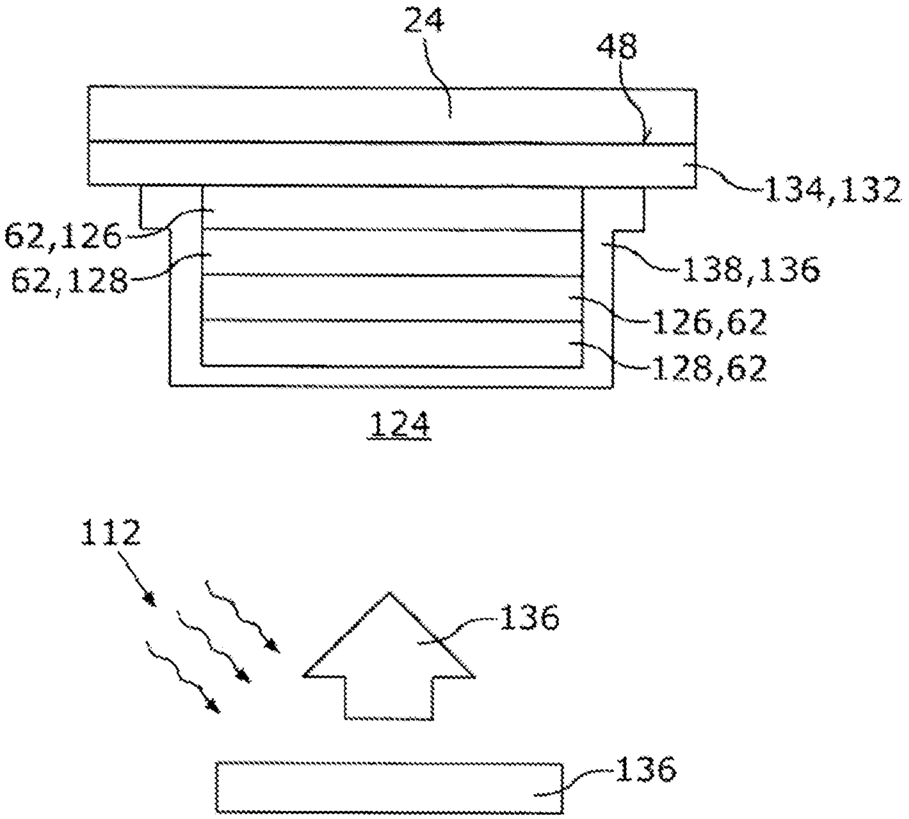

FIG. 17 additional step of adding a cover layer

Figure 18:
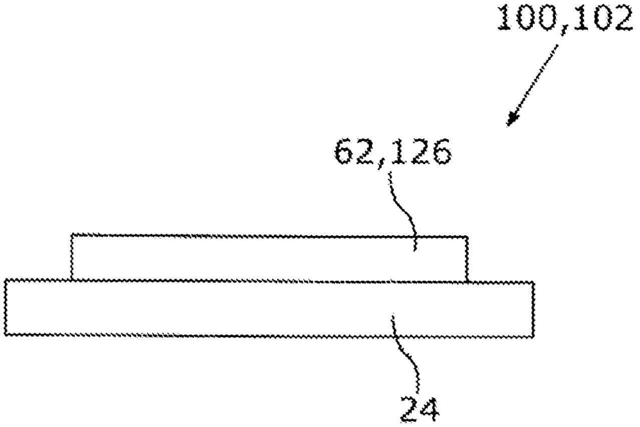

FIG. 18 a first example of a quantum device

Figure 19:
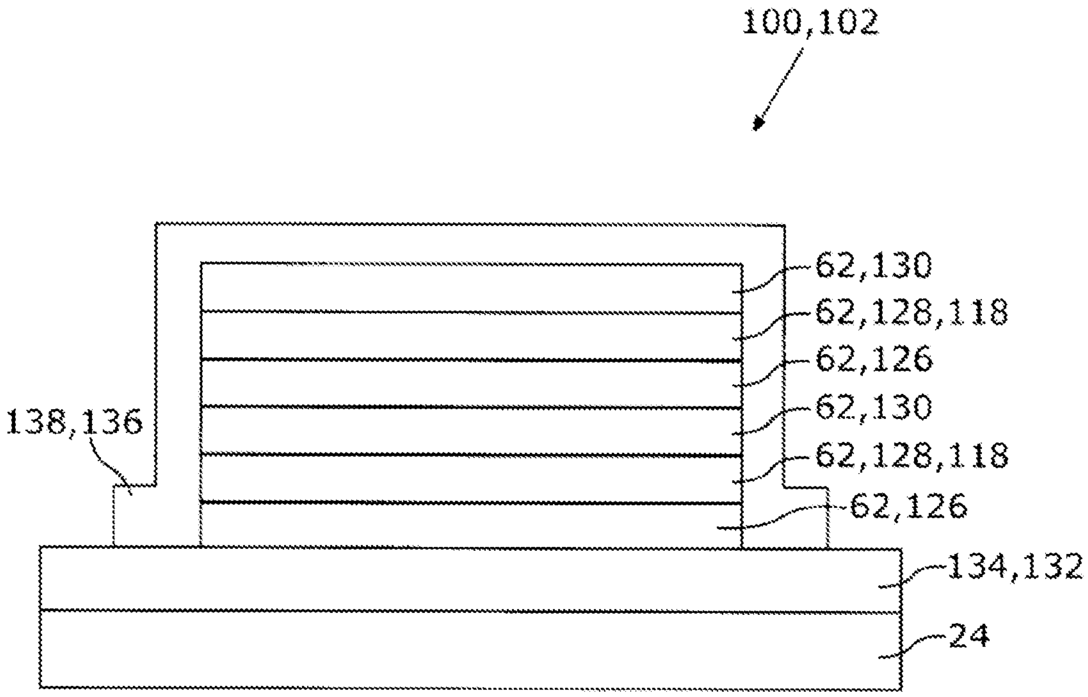

FIG. 19 a second example of a quantum device

Figure 20:
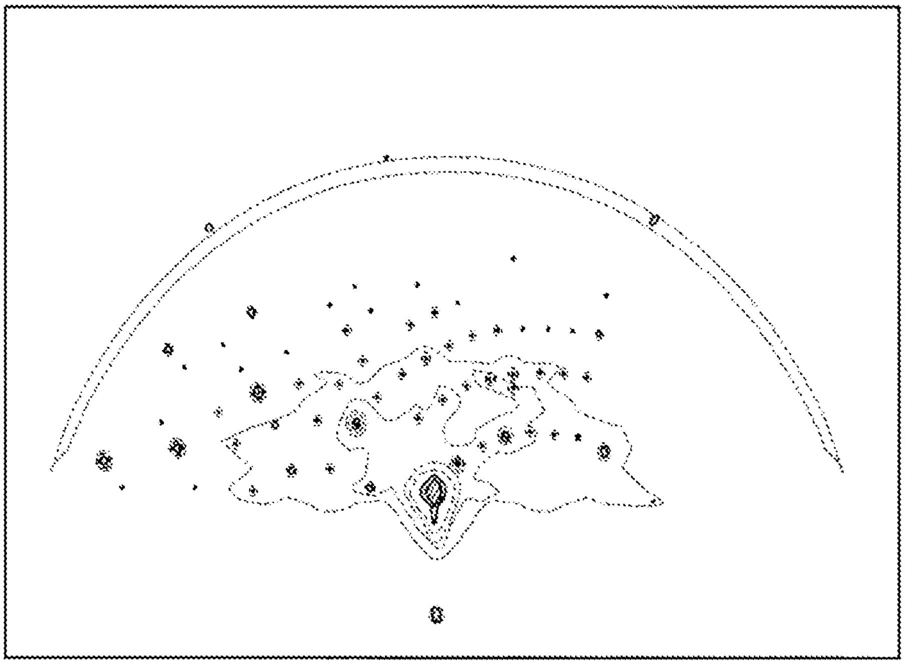

FIG. 20 RHEED pattern of the $\sqrt{31}\times\sqrt{31}$ surface reconstruction of $Al_2O_3$ with a single orientation of the rotation with respect to the principal crystal axes of the substrate. The substrate was annealed for 200 s at 1700° C. in an $O_2$ atmosphere of $1\times10^{-6}$ hPa and rapidly cooled down to 20° C. in this atmosphere. Image taken at 20° C., with the RHEED beam aligned along one of the principal crystal axes of the substrate.

Figure 21:
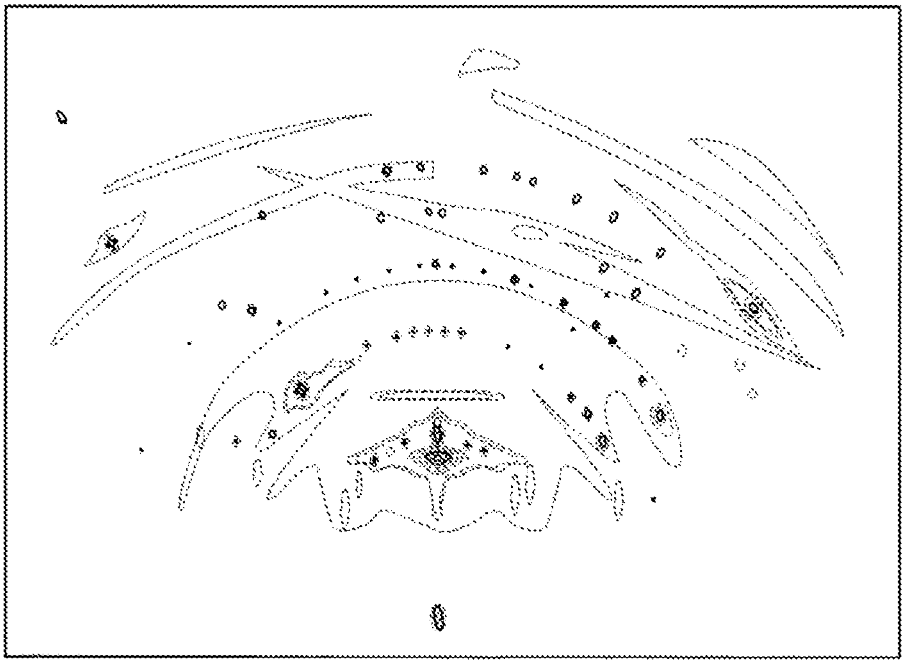

FIG. 21 RHEED pattern of the same sample as in FIG. 20, after rotating the substrate counterclockwise by 9°.

Figure 22:
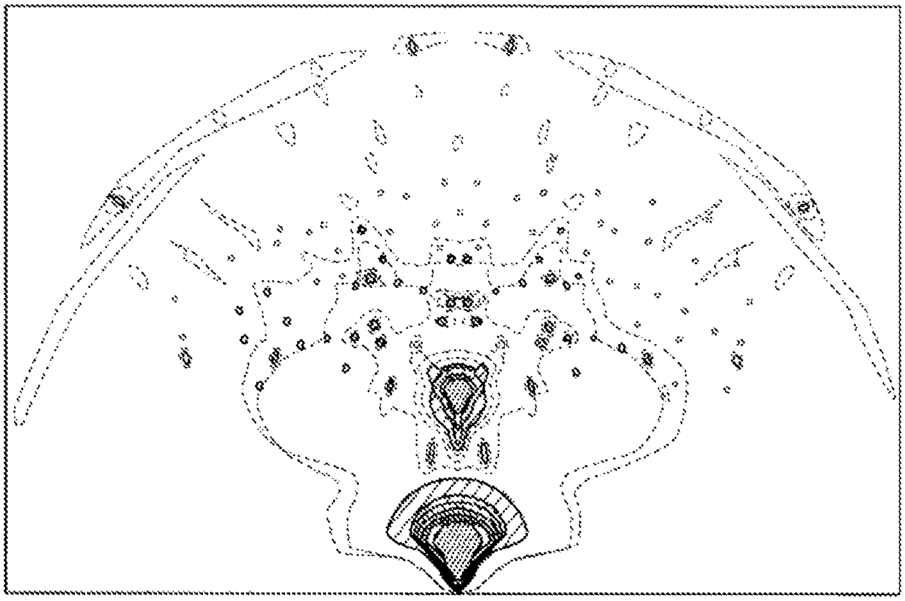

FIG. 22 RHEED pattern of the $\sqrt{31}\times\sqrt{31}$ surface reconstruction of $Al_2O_3$ with both possible orientations of the rotation with respect to the principal crystal axes of the substrate. The substrate was annealed for 200 s at 1700° C. in an $O_2$ atmosphere of $0.75\times10^{-1}$ hPa and rapidly cooled down to 20° C. in this atmosphere. Image taken at 20° C., with the RHEED beam aligned along one of the principal crystal axes of the substrate.

Figure 23:
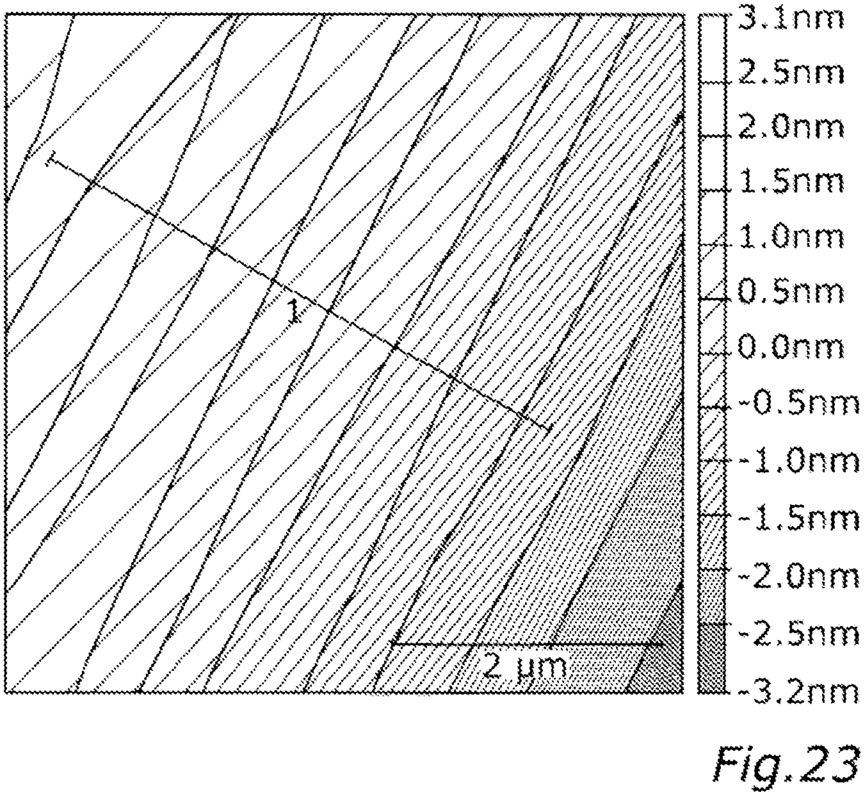

FIG. 23 AFM micrograph of an $Al_2O_3$ surface after the surface preparation process of the present invention. The substrate was annealed for 200 s at 1700° C. in an $O_2$ atmosphere of $1\times10^{-6}$ hPa and rapidly cooled down to 20° C. in this atmosphere.

Figure 24:
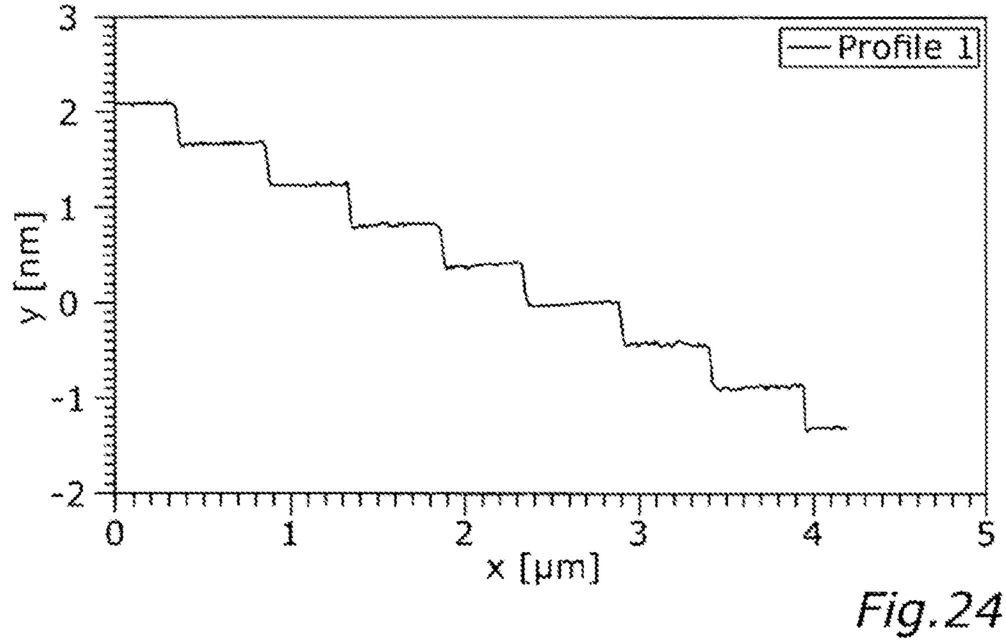

FIG. 24 Height profile extracted along the line in FIG. 22.

Figure 25:
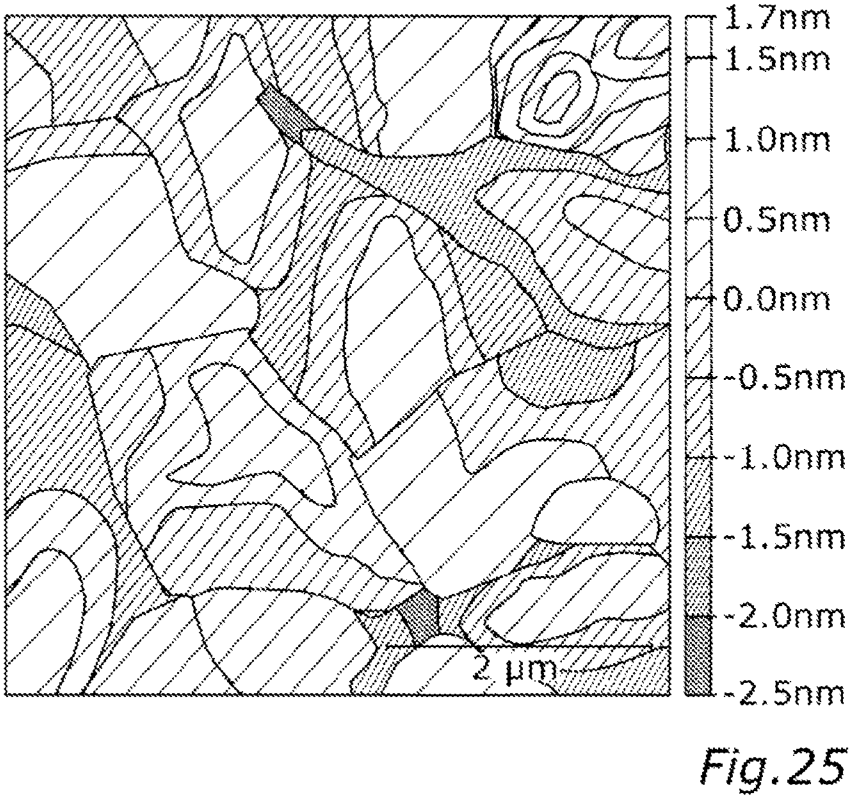

FIG. 25 AFM micrograph of a 50-nm-thick (1/40 of the length of the reference bar in the image) thin film of Ta grown on a $Al_2O_3$ substrate prepared by the method of the present invention. The substrate was annealed for 200 s at 1700° C. in an ultrahigh vacuum (pressure $<10^{-10}$ hPa) prior to deposition. The Ta film was grown with a pressure $<2\times10^{-10}$ hPa at 1200° C. substrate temperature from a locally molten Ta metal source.

Figure 26:
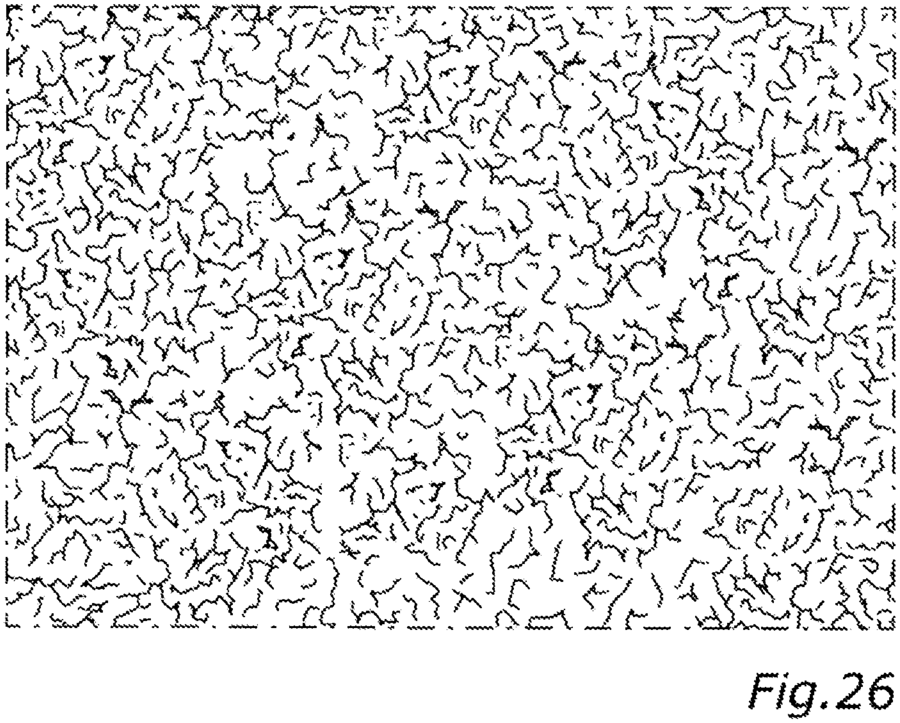
Figure 27:
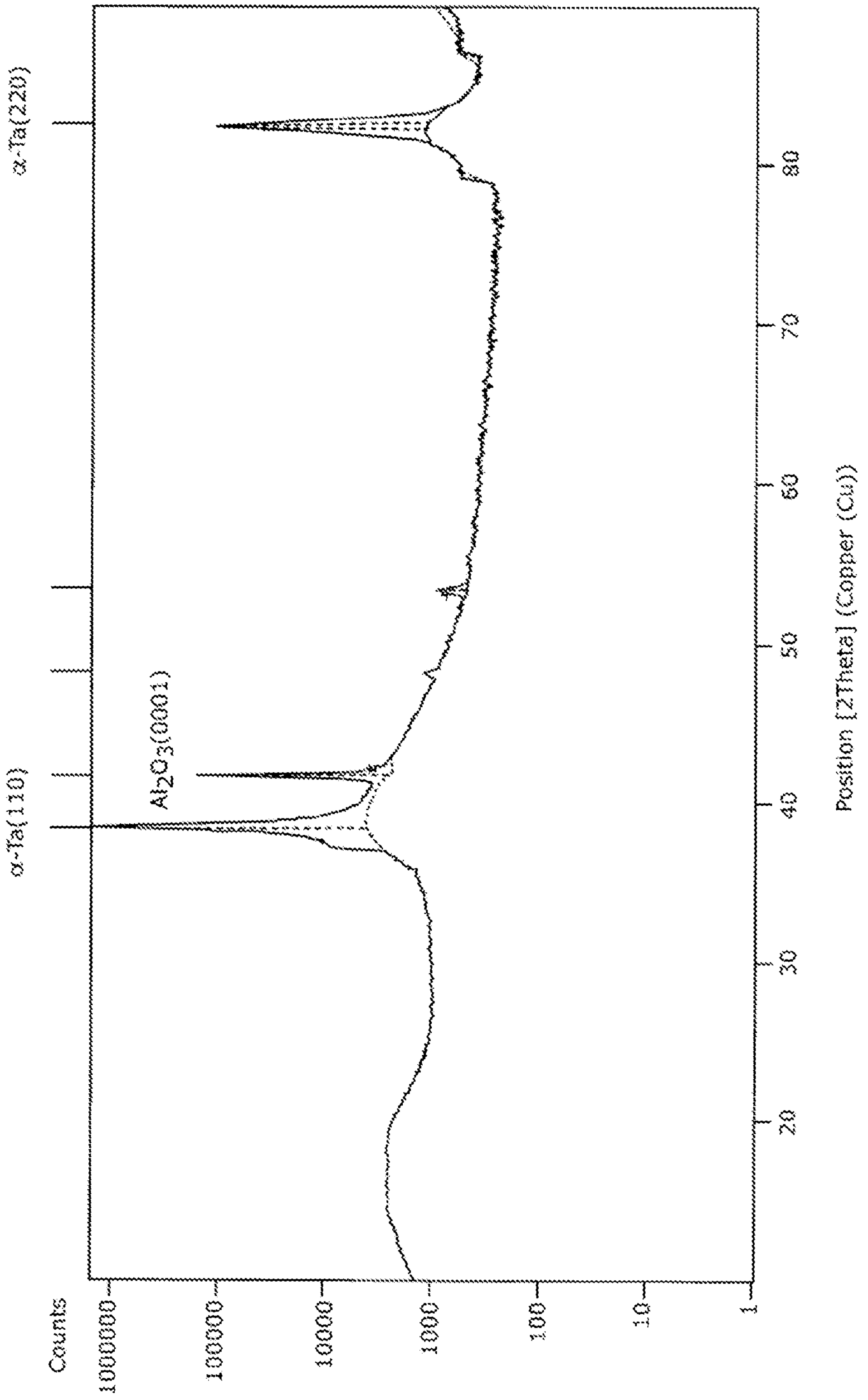
Figure 28:
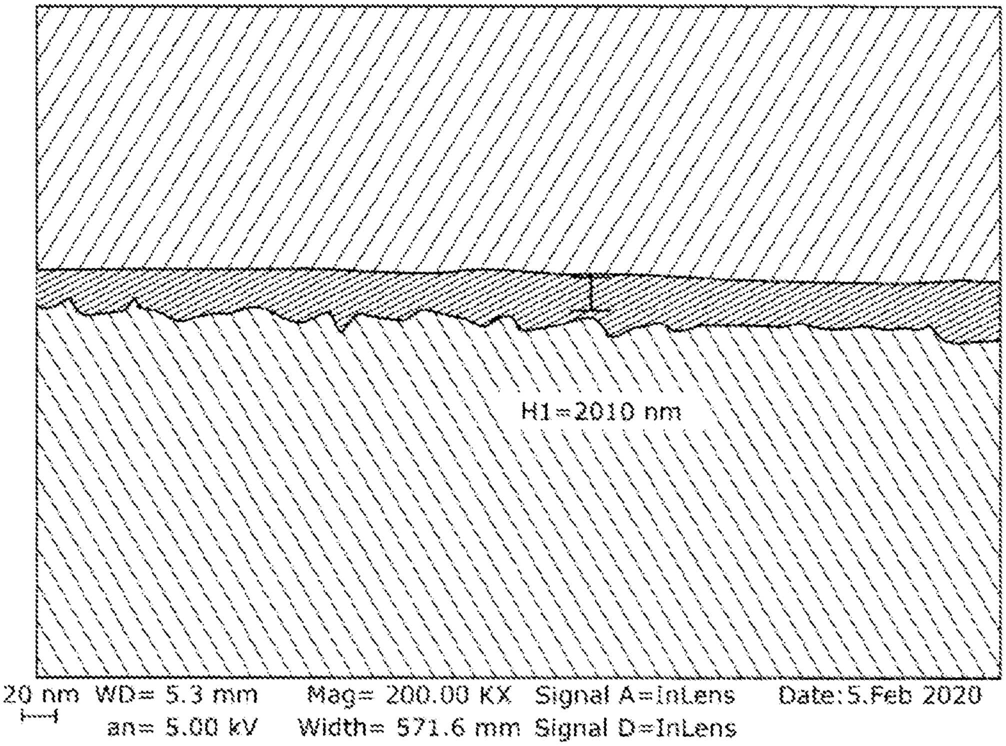

FIG. 26 SEM top-view micrograph of a 10-nm-thick thin film of Ta grown on a Al2O3 substrate prepared by the method of the present invention. The substrate was annealed for 200 s at 1700° C. in an ultrahigh vacuum (pressure <10-10 hPa) prior to deposition. The Ta film was grown with pressure <2x10-10 hPa at 1200° C. substrate temperature;

FIG. 27 XRD diffraction pattern of a 50-nm-thick thin film of Ta grown on a Al2O3 substrate prepared by the method of the present invention. The substrate was annealed for 200 s at 1700° C. in an ultrahigh vacuum (pressure $<10^{-10}$ hPa) prior to deposition. The Ta film was grown with pressure <2x10-10 hPa at 1200° C. Only the α-Ta (110)/(220) equivalent planes of the Ta film are visible normal to the surface, together with the substrate peak, confirming a single out-of-plane orientation of the Ta film corresponding to a complete epitaxial alignment;

FIG. 28 Nb film grown on a Si template without epitaxial orientation at room temperature by TLE. The deposition time was 40 min. The layer thickness is 20 nm. The low substrate temperature and lack of a clean epitaxial template produce a disordered columnar film structure with a large number of defects.

Figure 29:
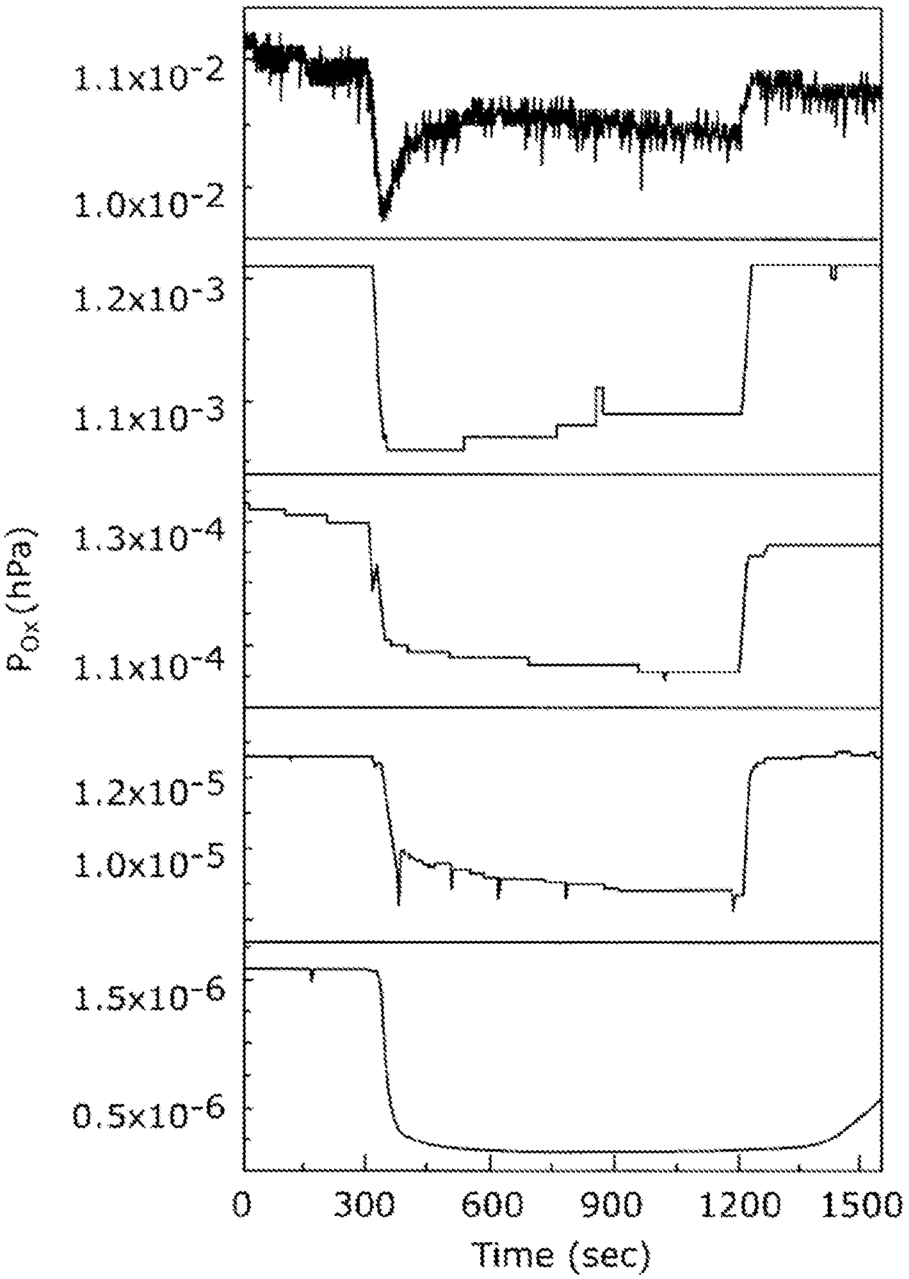
Figure 30:
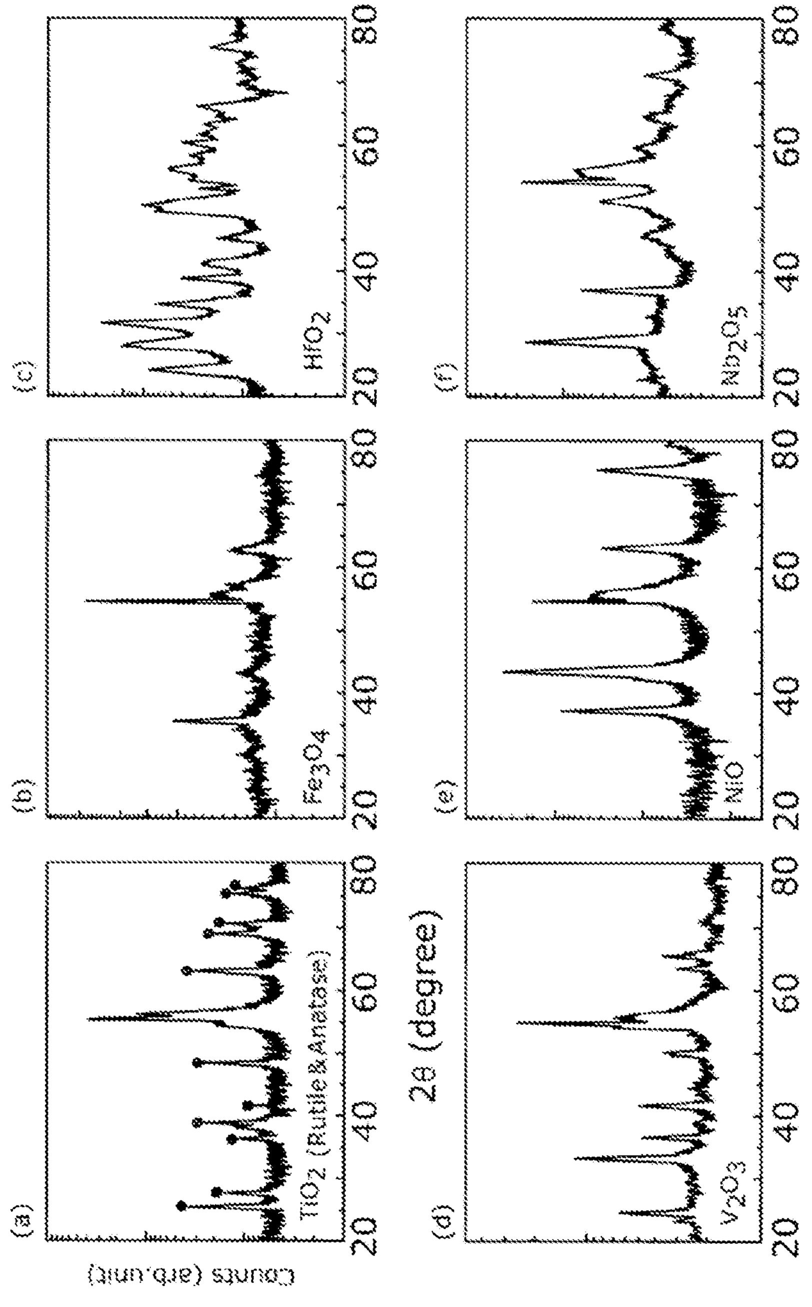
Figure 31:
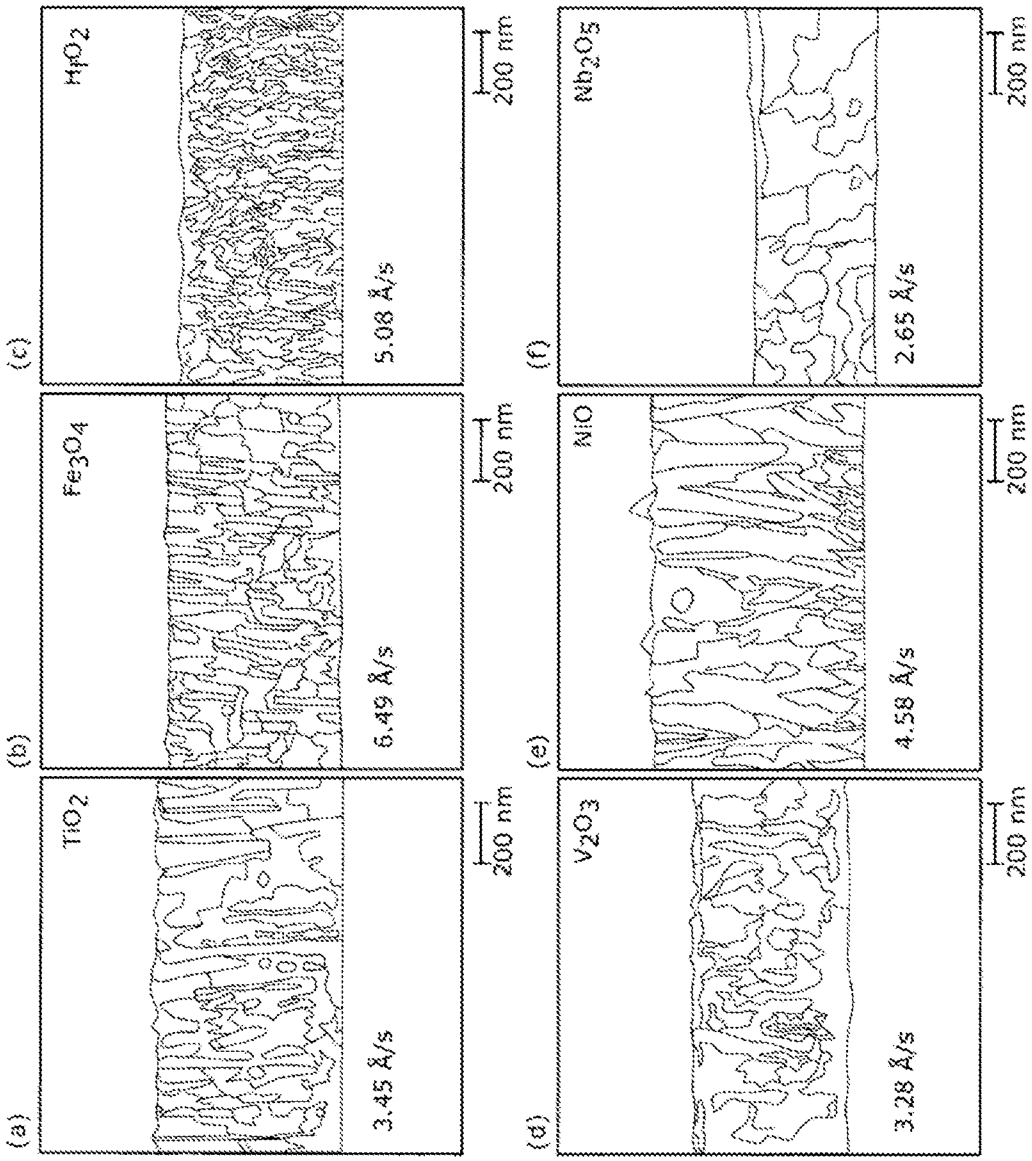

FIG. 29 chamber pressure $P_{ox}$ measured during the laser evaporation of Ti, using a constant laser power and oxygen-ozone gas flow;

FIG. 30 grazing-incidence x-ray diffraction patterns of (a) Ti-, (b) Fe-, (c) Hf-, (d) V-, (e) Ni-, (f) Nb-oxide films grown by TLE on Si (100) substrates. The expected diffraction peak positions of each oxide are marked in each figures by gray lines;

FIG. 31 cross-sectional SEM images of several oxide films deposited by TLE. Each panel shows the value of $P_{ox}$. Most films have a columnar structure.

Figure 32:
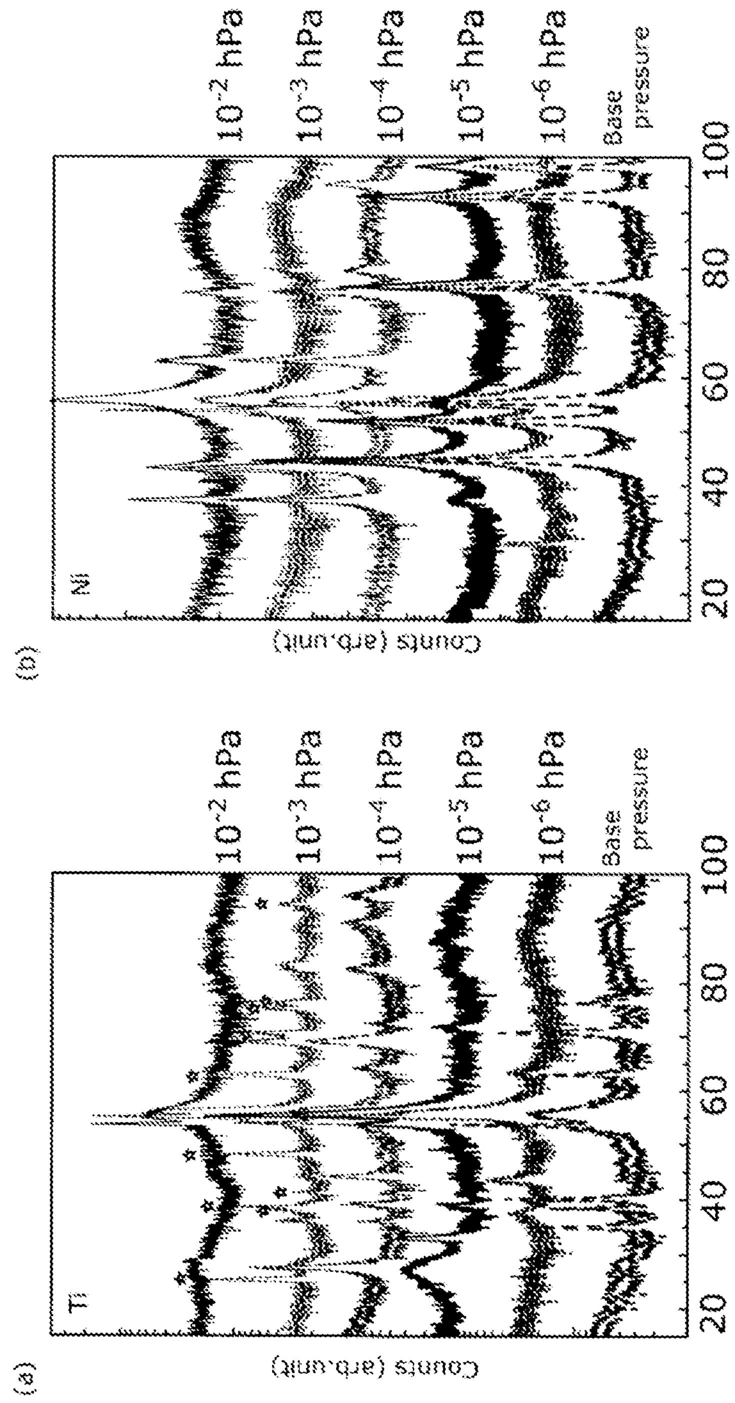

FIG. 32 grazing-incidence x-ray diffraction patterns of TLE-deposited (a) Ti-oxide and (b) Ni-oxide films for several $P_{ox}$ values. As $P_{ox}$ increases, the Ti source produces $TiO_2$ films in the rutile and anatase phases, whereas the Ni source forms partially oxidized Ni/NiO films. Gray lines and solid purple stars in (a) show the expected diffraction peak positions of $TiO_2$ rutile and anatase phases, respectively. Gray lines in (b) show the expected peak positions of cubic NiO; and.

Figure 33:
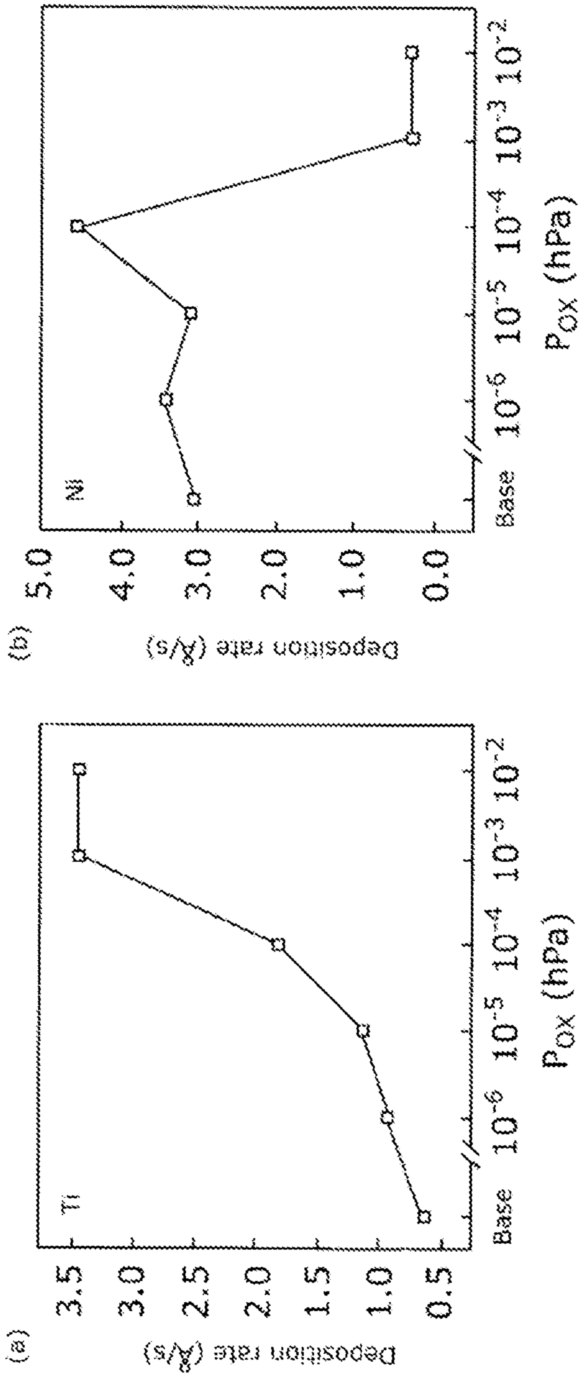

FIG. 33 deposition rates of (a) Ti (oxide) and (b) Ni (oxide) measured at several $P_{ox}$. The deposition rate of Ti increases with increasing $P_{ox}$, whereas for Ni an increase of $P_{ox}>10^{-3}$ hPa almost suppresses the evaporation process.

FIG. 1 shows a reaction chamber 10 for thermal laser epitaxy applications comprising a single vacuum chamber 12 defining a first reaction volume 14. The reaction chamber 10 can be sealed with respect to the ambient atmosphere, i.e. a laboratory, a factory, a clean room or the like. The vacuum chamber 12 can be pressurized to pressures ranging from between $10^1$ and $10^{-12}$ hPa, for pure ideal conditions to pressures in the range of $10^{-8}$ to $10^{-12}$ hPa using suitable vacuum pumps 18 that extract the air from the vacuum chamber 12 as is schematically illustrated by the arrow pointing out of the vacuum chamber 12, as is known to the person skilled in the art.

If required, a process gas G can be introduced into the vacuum chamber 12 from a gas supply 20 along the arrow pointing into said vacuum chamber 12. The process gas G, also known as reaction gas can be selected from such gases such as oxygen, ozone, plasma-activated oxygen, nitrogen, plasma-activated nitrogen, hydrogen, F, Cl, Br, I, P, S, Se, and Hg, or compounds such as $NH_3$, $SF_6$, $N_2O$, $CH_4$. The pressure of the process gas G can be selected in the range of $10^{-8}$ hPa to ambient pressure, respectively for pure ideal conditions in the range of $10^{-8}$ hPa to 1 hPa.

The vacuum pump 18 optionally together with the gas supply 20 provides a respective reaction atmosphere in the reaction chamber 10, i.e. a vacuum optionally combined with a pre-defined gas atmosphere.

The reaction chamber comprises a substrate arrangement 22 at which a substrate 24 can be arranged. In practice it is possible to provide a plurality of substrate arrangements 22 and/or to arrange a plurality of substrates 24 on one or more substrate arrangements 22.

The substrate 24 that is used can typically be a single crystal wafer, with a material of the wafer typically being selected from the group of members consisting of: SiC, AlN, GaN, $Al_2O_3$, MgO, $NdGaO_3$, $DyScO_3$, $TbScO_3$, $TiO_2$, $(LaAlO_3)_{0.3}(Sr_2TaAlO_6)_{0.35}$ (LSAT), $Ga_2O_3$, and $SrTiO_3$. Such single crystal wafers are typically used in the production of solid state components, and are interesting candidates for the production of quantum components, such as qubits.

During coating and pre-treatment of the substrate 24, which can be present in the form of a single crystal wafer, the substrate 24 is heated using a substrate heating laser 26.

The substrate heating laser 26 is typically an infrared laser that operates with a wavelength in the infrared region, specifically with a wavelength selected in the range of ca. 1 to 20 μm, especially of around 8 to 12 μm. Such wavelengths can e.g. be made available via a $CO_2$ laser 26.

The substrate heating laser 26 typically heats a substrate surface 48 of the substrate 24, i.e. a frontside of the substrate 24, via indirect heating via a backside 50 of the substrate 24. Thereby the substrate surface 48 can be heated to a temperature between 900° C. and 3000° C., in particular 1000° C. to 2000° C. Consequently, the intensity of the substrate heating laser 26 is varied to achieve the various desired temperatures in dependence on the sublimation rate respectively sublimation temperature of the substrate constituent having the highest sublimation rate.

Typically the intensity of the substrate heating laser 26 can be varied within the range of 4 W to 1 KW for substrate sizes of 5×5 $mm^2$ or 10×10 $mm^2$. To be able to reach the required preparation temperatures, 100 W are required for a 10×10 $mm^2$ sapphire substrate to reach 2000° C., 500 W are required for a 10×10 $mm^2$ $SrTiO_3$ substrate to reach 1400° C. The required temperature varies significantly. According to Planck's radiation law, the emitted power per area depends on the emittance of the material, which is a material property, and upon temperature as $T^4$, which means that the required power increases dramatically with temperature.

To cover the range of temperatures for the preparation of epitaxial templates according to the invention, we find a necessary maximum power density on the substrate of 1 kW/$cm^2$, with significantly smaller values such as e.g. around 100 W/$cm^2$ for sapphire at 2000° C.

Due to the dramatic $T^4$ dependence on temperature, the substrate heating laser at the same time requires a high dynamic range with the ability to maintain stable low power levels for materials that require lower temperatures for substrate preparation, and in particular for the deposition of epitaxial layers on the substrate template at lower temperatures.

It should also be noted that the substrate 24 may be heated from the front, the side or in a different manner. Depending on the heating means, it should simply be ensured that the temperature of the substrate surface 48 can be heated to within a range of 900° C. to 3000° C., in order to be able to ensure that one of the substrate constituents, i.e. one of the elements forming the substrate, can be moved along the substrate surface 48 during the heating step and may desorb or sublimate from the substrate surface 48 for generation of a desired epitaxial template 60 (see e.g. FIGS. 5 to 7 hereinafter).

The temperature of the substrate surface 48 can be measured using a pyrometer or the like (not shown).

As indicated by the double headed arrow 28, the substrate arrangement 22 can be transferred into and out of the vacuum chamber 12 using a suitable apparatus (not shown).

In order to coat the substrate 24 with one or more layers of thin films 62 (see FIGS. 14 to 20 in the following), the reaction chamber 10 further comprises first and second source elements 30, 32 arranged at a source arrangement 34. These source elements 30, 32 can also be provided as distinct component sections of a single source element 30.

In this context it should be noted that a material of the respective source 30, 32 can be selected from any element of the periodic table, provided it is solid at the temperatures and pressures selected within the respective vacuum chamber 12 used for the deposition of the thin film 62.

In this connection it should be noted that preferred materials for the respective source 30, 32 are Sc, Ti, V, Cr, Mn, Fe, Co, Ni, Cu, Zn, Zr, Nb, Mo, Ru, Hf, Al, Mg, Ca, Sr, Ba, Y, Rh, Ta, W, Re, Ir, Ga, In, Si, Ge, Sn, Eu, Ce, Pd, Ag, Pt, and Au, if the above elements are deposited in an oxygen/ozone mixture as a reaction atmosphere with approximately 10% to deposit binary oxides as thin films 62. In order to deposit single crystal thin films 62, a vacuum atmosphere is typically used.

First and second source heating lasers 36, 38 that are respectively directed at the first and second source elements 30, 32 are also provided. The first and second source heating lasers 36, 38 make available different evaporation and/or sublimation temperatures at the first and second source elements 30, 32.

The first and second source heating lasers 36, 38 typically make available laser light at the first and second source elements 30, 32 with a wavelength selected between 280 nm and 20 μm. For metallic sources, it is preferred if the source heating lasers 36 and 38 make available light in the wavelength range selected between 350 nm and 800 nm due to the increasing absorptivity of metals at shorter wavelengths. Although high-power lasers with short wavelengths below 515 nm are not yet commercially viable, the highest absorptivities according to low-power measurements can be expected at 300 nm. Should lasers with this wavelength become available, the preferred wavelength for the source heating lasers would be 300 nm±20 nm.

In this context it should further be noted that the lasers 26, 36, 38 can be operated in pulsed modes, but are preferably used as continuous sources of radiation. A continuous laser 26, 36, 38 introduces less energy per unit time than a pulsed source which could lead to a damaged source 30, 32

In order to sublimate and/or evaporate elements from the first and second source elements 30, 32 to ensure that these arrive at the substrate surface 48 for coating of the substrate 24, a suitable intensity of the first and second source heating lasers 36, 38 has to be selected. This intensity depends on the distance of the first and second source elements 30, 32 from the substrate surface 48. For a given flux density at the substrate surface, the intensity increases and/or decreases as the first and second source elements 30, 32 are moved away from and/or towards the substrate surface 48.

In the present examples, the substrate surface 48 is placed 60 mm away from the respective first and second source elements 30, 32. The intensity of the laser is correlated approximately to the square of the distance between the first and second source elements 30, 32 and the substrate surface 48. Hence for an increase of a factor two in the distance between the first and second source elements 30, 32 and the substrate surface 48, the intensity of the laser has to be increased by approximately a factor of four.

Hence, the intensities specified in the following are for a distance of 60 mm between the first and second source elements 30, 32 and the substrate surface 48. If a larger distance is selected then the intensity of the respective first and second source heating lasers 36, 38 has to be increased and vice versa, if the distance is reduced.

Generally speaking the substrate heating laser 26, the first and second source heating lasers 36, 38 make available laser light, in particular laser light with a wavelength between 10 nm to 100 μm, preferably with a wavelength selected in the visual or infrared range, especially with a wavelength between 280 nm and 1.2 μm. These lasers 26, 36, 38 make available first electromagnetic radiation and/or second electromagnetic radiation and/or third electromagnetic radiation, and/or further types of electromagnetic radiation.

The first and second source heating lasers 36, 38 are provided to evaporate and/or sublimate first and second materials from the first and second source elements 30, 32 by heating the first and second source elements 30, 32 to a temperature below the plasma threshold of the first material and/or of the second material.

A shielding aperture 40 is schematically illustrated in the vacuum chamber 12 that functions as a shield to prevent the sublimated and/or evaporated source material to deposit on an entrance window 52 of the chamber. If such a layer of material is deposited on the window 52, then the intensity of the respective laser 26, 36, 38 has to be adapted over time to compensate for this material absorbed on the window.

Moreover, the shielding aperture 40 can also act as a shield to prevent reflected laser light of one of the lasers 26, 36, 38 from being focused back into one of the lasers 26, 36, 38 which could destroy the respective laser 26, 36, 38.

The shielding aperture 40 can also form a part of a beam shaping system of one or more of the respective lasers 26, 36, 38 and can hence be used as a coupling means for coupling the respective electromagnetic radiation from the first and second source heating lasers 36, 38 into the reaction chamber 10 and onto the first and second source elements 30, 32.

Generally speaking a respective window 52 is arranged between each one of the lasers 26, 36, 38 and the reaction chamber 10 in order to couple the respective laser light into the reaction chamber 10 as further coupling means.

This means that the coupling means can comprise any kind of optical element or laser light beam shaping element that can be used to couple the light from one of the lasers 26, 36, 38 into the reaction chamber, i.e. on to the substrate 24 respectively onto one or more of the first and second source elements 30, 32 for its intended use.

It should be noted in this context that the reaction chamber 10 may also only comprise a single source element 30, or more than two source elements 30, 32, with the further source elements either making available further materials of the same or different kind that can be deposited onto one or more substrates 24 in the reaction chamber 10.

In this context it should be noted that if two or more source elements 30, 32 are made available in the vacuum chamber 12 that laser light from one of the first and second source heating lasers 36, 38 can be directed at one source element 30, 32 for the sublimation and/or evaporation of a thin film 62 comprising the material of the respective source element 30, 32, but not of the other source element 32, 30.

This process can be repeated for each source element provided in the vacuum chamber 12 in order to form multiple different layers and multi-layer and alloy or composite structures on the substrate 24.

Similarly both source elements 30, 32, and if provided, further source elements can have laser light from one of the first and second source heating lasers 36, 38, and if provided from a third source heating laser directed thereat in order to simultaneously sublimate and/or evaporate source material from a plurality of source elements 30, 32 in order to deposit a thin film 62 on the surface 48 of the substrate 24 for the deposition of a compound on the surface 48 of the substrate 24.

Hence the material of the thin film 62 or layer deposited on the substrate 24 is a reaction product of the evaporated and/or sublimated material and a component of the reaction atmosphere, i.e. if provided a compound reacted with the process gas G or a single material thin film 62 if the sublimation and/or evaporation is carried out in vacuum.

Regardless of how many source elements 30, 32 are provided in the vacuum chamber 12 and impinged with laser light at any one given time, a process gas may be introduced into the vacuum chamber and bring about a reaction of the evaporated and/or sublimated source material with the process gas, in order to generate thin films formed of compounds of the source material and of the process gas, such as oxides, as will also be discussed in the following.

It should further be noted that a material of the first and/or second source elements 30, 32 that is used for the evaporation and/or sublimation can be self-supporting and can thereby be provided crucible free, e.g. a Ta source element 30, 32 can be provided that has no crucible associated therewith.

FIG. 2 shows a second kind of reaction chamber 10 comprising two vacuum chambers 12 defining first and second reaction volumes 14, 16. The first and second reaction volumes are separated from one another via a gate valve 44.

Such reaction chambers 10 may be beneficially selected in the formation of multi-layered films (see FIGS. 14 to 19) where the films need to be formed in different reaction atmospheres, or if the substrates 24 are coated with different films in batches in different reaction chambers as part of a production line.

In this way the reaction chamber 10 comprises at least two separated reaction volumes 14, 16, whereby the at least two reaction volumes 14, 16 are sealable against each other, e.g. via the gate valve 44 and whereby the substrate arrangement can be moved between the at least two reaction volumes 14, 16 within the reaction chamber 10 continuously sealed with respect to the ambient atmosphere.

In this context it should be noted that the first reaction atmosphere and the second reaction atmosphere and, if provided, the third or further reaction atmospheres may be identical.

Alternatively, the first reaction atmosphere and the second reaction atmosphere and/or the third reaction atmosphere are different and are exchanged between different reaction volumes 14, 16 or within the first volume 14 and/or reaction volume 16, and/or the second reaction atmosphere and the third reaction atmosphere are different and are exchanged between different reaction volumes 14, 16 or within the first volume 14 and/or reaction volume 16.

In this context it should further be noted that the first reaction atmosphere and/or the second reaction atmosphere and/or the third or further reaction atmospheres are at least partly ionized or excited, in particular ionized by plasma ionization and/or excitation. Excitation describes the transition of one or more electrons within an atom or molecule to energetically higher levels. The relaxation from such higher levels may provide additional energy to enable or improve the chemical reaction between the evaporated atoms or molecules and the activated or ionized reaction gas.

Also for the preparation of the substrate surface 48, for the deposition of the one or more thin films, and for the terminal tempering and/or cooling, respectively, different reaction atmospheres might be suitable. Hence, the availability of different reaction volumes 14, 16 can be of further advantage.

In this context it should be noted that if a solid-state device, in particular a quantum device, preferably for a qubit, comprising one or more thin films 62 should be produced, with the one or more thin films 62 comprising a first material and each said film 62 having a thickness selected between a monolayer and 100 nm and being deposited onto a front surface of a substrate, then the production process can be carried out in a reaction chamber 10 as shown in FIG. 1 or in FIG. 2. The reaction chamber 10 is then sealed with respect to the ambient atmosphere in order to generate the controlled vacuum, optionally together with the gas reaction atmosphere made available with the process gas G.

Such a method comprises the steps of:

a) Preparing the front surface 48 of the substrate 24 by heating the substrate 24 with a first electromagnetic radiation coupled into the reaction chamber 10 while the reaction chamber 10 contains a first reaction atmosphere, e.g. vacuum, possibly in combination with a process gas 20 such as oxygen, in this context the first electromagnetic radiation is made available by the substrate heating laser 26, b) Evaporating and/or sublimating of the first material by heating a source element 30, 32 comprising the first material by a second electromagnetic radiation coupled into the reaction chamber 10, e.g. using one of the first and second source heating lasers 36, 38 while the reaction chamber 10 contains a second reaction atmosphere, e.g. a vacuum or a partial vacuum and predefined gas atmosphere, for depositing the thin film 62 comprising the first material and/or a compound of the first material onto the front surface 48 prepared in step a), and optionally c) Illuminating the one or more thin films 62 and/or the substrate 24 with a third electromagnetic radiation coupled into the reaction chamber 10 while the reaction chamber contains a third reaction atmosphere, for forming the solid-state device and for tempering and/or controlled cooling of the solid-state device, whereby during the steps a) to c) the reaction chamber stays sealed with respect to the ambient atmosphere and both the substrate and the subsequent solid-state device, respectively, continuously stay in the reaction chamber 10.

In this context it should be noted that a possible method of preparing the front surface 48 of the substrate 24 can be made available in accordance with the following teaching. It should however, be noted that for less pure layer structures on the substrate 24 also conventional cleaning and purification steps can be carried out.

A specific method of preparing a surface 48 of a single crystal wafer 24 as an epitaxial template 60, the surface 48 comprising surface atoms and/or surface molecules, the single crystal wafer 24 comprising a single crystal composed of two or more elements and/or two or more molecules as substrate constituents, each element and molecule respectively having a sublimation rate, the method comprising the steps of:

providing the single crystal wafer substrate 24 with a defined miscut angle and direction;

heating the substrate 24 to a temperature at which the surface atoms and/or the surface molecules can migrate along the surface 48 to form an arrangement with a minimal step density and step edges oriented according to the predefined miscut angle and miscut direction;

heating the substrate 24 to a temperature at which atoms or molecules of the substrate constituent having the highest sublimation rate may leave the surface (sublimate, desorb).

Optionally, the surface 48 of the substrate 24 can be irradiated with a continuous flux of the same species to obtain a defined flux equilibrium between atoms or molecules leaving the surface and reaching the surface (chemical potential). This step usually leads to a surface reconstruction which may have energetically equivalent in-plane orientations.

Thereby one can cause a symmetry breaking of the atoms and/or molecules present at the substrate surface 48 due to the step orientation which forces the surface 48 to form only one of the different in-plane orientations.

Crystalline layers that have an orientation uniquely defined with respect to the crystal orientation of the substrate 24 (epitaxial layers) may grow in different in-plane orientations if the surface has different orientations of the surface reconstruction. This leads to defects in the epitaxial layers. This is avoided if using the method of preparing the substrate as disclosed herein by providing only one single orientation of a surface 24 reconstructed using this method.

In this context it should be noted that the sublimation rates of the two or more elements and/or two or more molecules at a given temperature usually differ from one another.

The step of heating the single crystal wafer 24 comprises two heating components: a first component of heating the single crystal wafer 24 at a surface disposed remote from the surface 48 to be treated and a second component of heating is provided by irradiating the surface 48 to be treated with thermal black-body radiation generated by the hot evaporation sources 32, 34.

The flux introduces a pressure on the surface 48 which competes with the desorption flux from the surface, thereby establishing an equilibrium which defines the chemical potential of the flux species at the surface.

Heating the substrate surface and irradiating it with a balancing flux of the volatile component causes several processes to become active.

The first one is the definition of a specific termination ('black' or 'white', schematically), referring to FIGS. 6 and 7 with respect to FIG. 3, which defines the repetition period of the surface structure and therefore the step height normal to the crystal plane closest to the miscut plane.

The second one is the mobilization of atoms along the surface such that the lowest energy surface in terms of the step structure is adopted, which is the lowest number of steps given by the step height of the first step and the miscut angle.

The third one is the formation of a specific surface reconstruction determined mainly by the substrate temperature and the chemical potential of the volatile flux as controlled by setting the volatile flux.

The fourth one is the selection between different energetically equivalent orientations of the surface unit cell by the choice of miscut direction as shown schematically in FIG. 13.

The flux of material, e.g. oxygen for a sapphire substrate 24 fills defects in the surface 48 and aids in providing a surplus of atoms to obtain an equilibrium between atoms leaving and adding atoms to the surface 48. This can be varied by adapting the pressure exerted by the flux, i.e. the amount of oxygen impinged onto the substrate.

By way of example it should be noted that the sublimation temperature is typically a temperature greater than 950° C., around 1700° C. for sapphire and around 1300° C. for $SrTiO_3$.

The two or more elements and/or two or more molecules of the crystal forming the single crystal wafer 24 can be selected from the group of members consisting of: Si, C, Ge, As, Al, O, N, O, Mg, Nd, Ga, Ti, La, Sr, Ta and combinations of the foregoing, by way of example, the single crystal wafers 24 can be made from one of the following compounds SiC, AlN, GaN, $Al_2O_3$, MgO, $NdGaO_3$, $TiO_2$, $(LaAlO_3)_{0.3}(Sr_2TaAlO_6)_{0.35}$ (LSAT), $Ga_2O_3$, $SrLaAlO_4$, Y:$ZrO_2$ (YSZ) and $SrTiO_3$.

The step of heating is carried out by the substrate heating laser 26 optionally in combination with one of the first and second source heating lasers 36, 38 provided the respective source comprises a material of the single crystal wafer 24 that has the highest sublimation rate and that should be continuously supplied towards the substrate.

The step of heating during the preparation of the substrate 24 is typically carried out in a vacuum atmosphere selected in the range of $10^{-8}$ to $10^{-12}$ hPa if no equilibrium between the desorbing flux and a compensating stabilization flux is desired.

With a stabilizing flux, the step of heating during the preparation of the substrate 24 is typically carried out in a vacuum atmosphere selected in the range of $10^{-6}$ to $10^{3}$ hPa.

Thereby an epitaxial template 60 can be formed as shown schematically e.g. in FIGS. 5 to 8 in the following.

Generally speaking the substrate 24 is selected such that the substrate matches the layer structure that is to be grown/deposited thereon. Generally speaking a substrate 24 is used which is the same as the thin film 62 grown thereon or deviates by at most 10% from the thin film 62 in one or more of the following aspects, preferably in all of the following aspects: lattice symmetry, lattice parameter, surface reconstruction, and surface termination.

In order to facilitate this it may be necessary or beneficial to deposit a buffer layer on the surface 48 prior to depositing a thin film 62 thereon.

The invention describes a solution to the problem of providing an essentially single crystalline template for subsequent epitaxy or other applications in which a uniform atomic arrangement both normal to the surface 48 and in-plane is advantageous.

FIG. 3 shows a schematic cut through a crystal 24 consisting of at least two elements or formula units, oriented in such a way that the surface 48 cut through the crystal exposes an alternating arrangement of terraces 58 composed of the two or more elements or formula units. For the sake of clarity, FIG. 3 shows just two elements or formula units colored in black and white. For surface preparation, the crystal 24 is subjected to a high enough temperature such that atoms or molecules may leave the surface 48 or attach to it, and fluxes of both atoms or molecules corresponding to the formula units within the crystal 24 are available such that the crystal 24 and the fluxes are in equilibrium with each other. As can be seen from FIG. 3, the surface 24 usually exposes alternating terraces 58 with different surface composition, and a step height corresponding to the smallest stable step size (formula unit) within the crystal 24.

FIG. 4 shows an epitaxial layer 60 respectively a thin film 62 deposited on the surface 48 of the substrate 24 of FIG. 3 and faulty epitaxy due to a mismatch of step heights or surface chemistry.

For the typical case shown, the step height of the terrace 58 structure does not match the lattice constant of the epitaxial layer 60. This causes the formation of stacking offsets at step edges 66, where the unit cells of the epitaxial layer 60 become shifted with respect to each other. For clarity, in FIG. 4 this shift is only due to the step height. It may also be caused by the alternating surface chemistry ('white' vs. 'black') on subsequent terraces, leading to a different interface structure between substrate and epitaxial layer on both terraces. Usually, such a chemical mismatch also produces a geometrical offset in the interface, with additional other detrimental effects such as e.g. local charges and structural defects. Instead, we would like to achieve the interface structure shown in FIG. 5, in which the lattice constants of the epitaxial layer 62, i.e. the thin film 62, and the substrate 24 match, and the epitaxial layer 62, i.e. the thin film 62 always grows on one and the same exposed surface layer everywhere. In addition, this match shall not only apply to the direction normal to the interface, but the surface 48 shall also expose a single in-plane orientation of the crystal structure, avoiding the formation of different domains rotated around the surface normal, or mirrored at a plane not parallel to the surface or the exposed terraces.

Using the method of preparation described herein allows to prepare a surface 48 as an epitaxial template 60 that offers both a uniform surface chemistry on all terrace 58 surfaces and a single in-plane orientation of the (usually reconstructed) surface atomic arrangement. The situation shown in FIG. 3 is somewhat idealized in that for most crystalline solids the vapor pressure of its constituents, either elemental or molecular, often differs strongly. Therefore, especially without any flux of atoms or molecules impinging on the surface 48 during the preparation of the substrate 24, one species will preferentially leave the surface 48 if the substrate 24 is heated to a sufficiently high temperature.

The situations shown in FIGS. 6 and 7 therefore occur so selectively that usually only one of the situations can be realized in practice. Nevertheless, the two figures show the two extremes that are in principle possible for surface preparation: depending on the relative overpressure of one constituent over the other in the impinging gas phase, the surface 48 can be prepared in a state such that one type of terrace, either the 'white' one (FIG. 6) or the 'black' one (FIG. 7), grows at the expense of the other type, ultimately covering the entire surface.

In practice, a complete coverage can only be achieved with the less volatile element or formula unit covering the surface 48, since such chemical equilibria typically require many orders of magnitude of pressure difference between the different constituents to reach a nearly complete dominance of one element or formula unit. Notably, also the intrinsic volatility difference between the two usually amounts by itself to several orders of magnitude.

The method of preparation therefore consists of heating the substrate crystal 24 to a temperature at which at least the most volatile constituent of the crystal sublimates from the surface 48. It may be necessary to even irradiate the surface 48 with a flux of the volatile species at higher temperatures to avoid the decomposition of the crystal 24 into different, unwanted compounds. Using a sufficiently high temperature such that

- the surface 48 can exchange atoms of at least the volatile species with its surroundings, and
- the mobility of atoms along the surface 48 is high enough to form highly ordered, minimum energy terraces, allows the desired double-step surface structure with uniform surface chemistry to form.

In practice, the surface 48 does not switch between bulk-terminated surface layers, but instead forms surface reconstructions, in which the surface atoms rearrange into positions different from the bulk, often even with different stoichiometries, such that the surface energy is minimized. This is illustrated in FIG. 8, where such a surface reconstruction containing additional 'black' material is indicated by a thicker black layer.

Depending on the pressures of the impinging species and the surface temperature, often different surface reconstructions are possible for a given termination, e.g. on sapphire, where there are at least two different Al-rich surface reconstructions.

A surface reconstruction usually involves the formation of a surface supercell spanning several unit cells of the underlying bulk crystal. An arbitrary illustrative example is shown in FIG. 7 for a surface unit cell which covers two bulk unit cells and has two equivalent, mirror symmetric surface unit cells. For both cases, two surface unit cells are shown; in practice the surface unit cells periodically repeat along the surface 48 in both directions and cover the entire terrace 58. In the example, both orientations of the surface unit cell have the same energy, and therefore nucleate with equal probability independently of each other such that across large areas, on average half the surface 48 is covered with each orientation.

This is an undesired configuration, since it leads to faulty boundaries where the domains meet. When used as a template for epitaxial growth, such different surface reconstruction domains may also cause different orientations of the epitaxial film 62 grown on top of it, thereby transferring the in-plane surface reconstruction domain boundaries into the epitaxial film 62 as three-dimensional planar domain boundaries between crystallites of different orientation. This problem may be solved by breaking the symmetry of the surface 48, and thereby favoring one surface unit cell orientation over the other by making them energetically inequivalent.

FIG. 9 shows two mirror symmetric unit cells of a surface reconstruction. This is the case e.g. with a Sapphire single crystal wafer 24, where the miscut produces a surface with two different orientations which can lead to the situation shown in FIG. 4.

The proposed way to achieve this according to the invention is the orientation and slope of the surface miscut. When cutting the substrate discs ('wafers' 24) from the bulk single crystal, the cutting plane may be directed slightly away from the crystal plane. Depending on this viscinal miscut angle, the prepared surface 48 will have terrace widths and terrace orientations that depend on the direction of the cut and can therefore be controlled at will. Looking at one possible example of a cubic in-plane crystal structure, three different resulting terrace structures are shown schematically in FIGS. 11-13.

FIG. 10 shows a terraced step system 58 of a substrate surface 48 perfectly aligned with the underlying crystal structure. In the illustrative example, this step orientation does not favor one of the two possible in-plane orientations of the surface unit cell of FIG. 9, as both make the same angle with the surface steps.

FIG. 11 shows an in-plane orientation slightly away from the in-plane crystal axis in the vertical direction. The edges of the big square indicate the faces of the bulk cubic crystal. Finally, FIG. 12 shows a terrace train oriented at 45° from the in-plane axes.

This miscut, just as any other way of breaking the symmetry of the system, may now be used to favour one of the two different surface unit cells as indicated in FIG. 13. In this schematic representation, the in-plane terrace system is prepared with a step orientation parallel to one of the equivalent surface reconstruction unit cells, which in this example favors the alignment of the surface reconstruction unit cell with the step edges, the top orientation, and suppressing the bottom, crossed-out orientation.

While the in-plane orientation of the step edges, corresponding to the azimuthal component of the miscut angle, selects one surface unit cell orientation over the other, the absolute value of the miscut angle, its polar component, is also important in stabilizing the single orientation structure. At high temperatures, entropy introduces statistical disorder into any system. In this case, as the in-plane surface unit cell orientation is established at an edge and then propagated from unit cell to unit cell, this may lead to faults with again oppositely oriented unit cells at certain average distances on each terrace. With a sufficiently high absolute value of the miscut angle, e.g. 0.05°, the stabilizing steps that imprint one orientation over the other occur at such short distance that this deviation, and thereby increase of defect density, can be avoided.

FIG. 14 depicts the three basic steps, denoted with A, B, and C, respectively, of the method for producing a solid-state component 100. The steps are carried out in a reaction chamber 10 (see FIG. 1). In particular, the reaction chamber 10 stays sealed against the ambient atmosphere for the whole production process. This allows to keep the advantages of each steps with respect to a lowering of the number of defects in the formed solid-state component 100, resulting in qubit relaxation times and qubit coherence times above 100 μs, preferably above 1000 μs, even more preferably above 10 ms.

In the first step a) of the method, shown on the left of FIG. 14 and denoted with "A", the substrate 24 is prepared, e.g. as discussed herein or simply in a gas atmosphere as is known in the state of the art. A first reaction atmosphere 116 is filled into the reaction chamber 10. In particular, the substrate 24 is heated by a first electromagnetic radiation 104. This first electromagnetic radiation 104 is preferably provided by a substrate heating laser 26, see FIG. 1, 2. By heating the substrate, as shown preferably from a the backside 50 opposite to the substrate surface 48, annealing effects can be triggered.

In addition, the first reaction atmosphere 116 can be chosen such that also a composition of the substrate surface 48 is maintained, i.e. a suitable reaction or process gas G can be used, e.g. oxygen in the case of $Al_2O_3$ to avoid oxygen depletion and the formation of oxygen vacancies. Further, also a flux of termination material T can be directed onto the substrate surface 48. Preferably, the termination material T comprises, especially consists of, an element of the material of the substrate 24. By this, the termination material T can fill defects on the substrate surface 48 caused by missing atoms or molecules and/or can provide a pressure on the substrate surface 48, preventing atoms or molecules to evaporate from the substrate surface 48.

As an overall result, after step a) the substrate surface 48 is preferably free or at least depleted of defects with respect to the lattice structure of the substrate 24, whereas in addition also defects with respect to surface reconstruction and surface termination can be drastically reduced, preferably down to zero.

In the following step b), shown in the middle of FIG. 14 and denoted with "B", one or more thin films 62 containing a first material 126 are deposited onto the substrate surface 48 previously prepared in step a). As mentioned above, the reaction chamber 10 stays sealed with respect to the ambient atmosphere between step a) and step b).

In this connection it should be noted that a thin film 62 as described herein is a layer of atoms or molecules of the same kind, or a formula unit as a closed film, having a thickness between a monolayer and 100 nm.

As shown in "B" of FIG. 14, the first material 126 is provided as first source 30, i.e. as source element, provided within the reaction chamber 10 by a source arrangement 34. The first source 30 is heated by a suitable second electromagnetic radiation 106, preferably provided by a first source heating laser 36 (see FIGS. 1, 2) for an evaporation and/or sublimation of the first material 126. By using the second electromagnetic radiation 106, no additional components, which would be sources for impurities and hence defects of the thin film 62, are needed within the reaction chamber 10 for the evaporation and/or sublimation process.

During the deposition process, the reaction chamber 10 can be filled with a second reaction atmosphere 118. In addition to a high vacuum as second reaction atmosphere 118, as preferably used for high purity thin films 62 consisting of the first material 126, also a suitable process gas G can be used as second reaction atmosphere 118. By this, evaporated and/or sublimated first material 126 (depicted as arrow 126 in "B" of FIG. 14, can react with the second reaction atmosphere 118 and the respective reaction product consisting of the first material 126 and the material of the process gas G of the second reaction atmosphere 118 is deposited onto the substrate surface 48. As an example, the first material 126 can be a metal and the process gas can be oxygen, resulting in an oxide of the metal deposited as thin film 62.

In summary, after step b) one or more thin films 62 are deposited onto the substrate surface 48. By using a second electromagnetic radiation 106, a wide range of first materials 126 can be used, where-by the range of possible compositions of materials of the one or more thin films 62 is further enlarged by choosing a suitable second reaction atmosphere 118. Further, an especially pure evaporation and/or sublimation of the first material 126 can be ensured. Hence, also building on the preferably defect free substrate sur-face 48, the one or more thin films 62 are preferably also free or at least depleted of substrate-induced defects.

In the last step c) of the method, depicted in FIG. 14 on the right and denoted by "C", a third electromagnetic radiation 108 is used for illuminating the substrate 24 and the one or more thin films 62. This finally forms the solid-state component 100. In the particularly depicted embodiment, the third electromagnetic radiation 108 applies heat to the backside 50 of the substrate 24 and thereby indirectly to the one or more thin films 62.

The third electromagnetic radiation 108 can serve two purposes. First of all, the applied heat can be used to temper the solid-state component 100. A further reduction of the already low number of defects of the solid-state component 100 can thereby be provided.

Secondly, also a controlled cooling of the solid-state component 100 can be provided by a suitable variation, in particular reduction, of the intensity of the third electromagnetic radiation 108. Defects caused by different thermal expansions of the substrate 24 and the one or more thin films 62 can thereby be avoided.

Both the tempering and the controlled cooling, respectively, can be supported by filling the reaction chamber 10 with a suitable third reaction atmosphere 120.

In summary, the solid-state components 100 produced with a method shown in a very basic version in FIG. 14 comprises no or at least a very low number of defects, ideally such that qubit relaxation times and qubit coherence times above 100 μs, preferably above 1000 μs, even more preferably above 10 ms can be achieved. By that, such solid-state components 100 are splendidly suitable for a usage as basis of a quantum component 102, see FIG. 18, 19, in particular for a qubit.

FIG. 15 shows an optional sub-step performed of step a) of the method shown in FIG. 14. A buffer material 132 is evaporated and/or sublimated by a fourth electromagnetic radiation 110, again providing all advantages described above with respect to the usage of an external source of the energy needed for evaporation and/or sublimation processes.

The evaporated and/or sublimated buffer material 132 (see the respective arrow 132 in FIG. 15) is deposited onto the substrate surface 48 and forms a buffer layer 134. Again, a suitably chosen fourth reaction atmosphere 122 is used for supporting this deposition. In other words, the subsequent deposition of the one or more thin films 62 (see FIG. 17, 19) is done onto the buffer layer 134. The buffer layer can be used to equalize differences between the substrate 24 and the undermost thin film 62, in particular with respect to lattice parameters. Defects caused in the one or more thin films 62 by such differences can thereby be suppressed.

A snap-shot of a possible embodiment of step b) of the method is shown in FIG. 16. In particular, the actually depicted deposition process comprises that a first material 126 and a second material 128 are simultaneously evaporated and/or sublimated. The reaction chamber is filled with a suitable second reaction atmosphere 118.

In the depicted embodiment, the second electromagnetic radiation 106 comprises two component beams 114, one of them directed onto the first source 30 comprising the first material 126, the other directed onto the second source 32 comprising the second material 128. The respective component beam 114 is adoptedly chosen for the evaporation and/or sublimation of the respective material 126, 128.

The evaporated and/or sublimated first and second materials 126, 128, see the respective arrows 126, 128, are deposited together and form one thin film 62. For instance, both materials 126, 128 can be metal elements, and the thin film 62 is formed by an alloy of these metals.

Please note that the thin films 62 depicted in FIG. 16 comprise a multi layer structure, wherein also layers consisting of a third material 130 are present. If the respective second reaction atmosphere 118 for the deposition of the third material 130 is different to the second reaction atmosphere 118 suitable and used for the simultaneously deposition of the first and second material 126, 128 depicted in FIG. 16, conveniently a reaction chamber 10 with two reaction volumes 14, 16 (see FIG. 2) can be used, wherein one of the two deposition processes takes place in the first reaction volume 14 and the other in the second reaction volume 16.

FIG. 17 shows an optional sub-step performed between the last iteration of step b) and the following step c) or after step c) of the method shown in FIG. 14. A cover material 136 is evaporated and/or sublimated by a fifth electromagnetic radiation 112, again providing all advantages described above with respect to the usage of an external source of the energy needed for evaporation and/or sublimation processes.

The evaporated and/or sublimated cover material 136 (see the respective arrow 136 in FIG. 17) is deposited onto the thin films 62, in the particular example depicted in FIG. 17 a multi layer structure comprising four layers alternatingly consisting of a first material 126 and a second material 128, respectively, and forms a cover layer 138. Also for the deposition of the cover layer 138, a suitably chosen fifth reaction atmosphere 124 is used for supporting this particular deposition. The cover layer 138 shields the thin films 62 against external influences. Defects caused by such external influences, for instance undesired deposition of further material onto the topmost layer of the thin films 62, can thereby be avoided.

In FIG. 18, 19 quantum components 102 are shown, which are based on a solid-state component 100 according to the present invention. FIG. 18 shows a very simple quantum component 102, FIG. 19 a more sophisticated one. In addition, several patterning steps, usually performed by photolithography, etching, ion-milling and other suitable procedures are required to obtain a functioning quantum component.

The solid-state components 100 have in common that they comprise a low enough number of defects per $cm^2$ and layer that have qubit relaxation times and qubit coherence times above 100 μs, preferably above 1000 μs, even more preferably above 10 ms and/or is produced by the method according to the present invention. The low number of defects of the solid-state component 100 provides long coherence times for the quantum component 102.

The quantum component 102 shown in FIG. 18 comprises a single thin film 62 consisting of a first material 126. The thin film 62 is deposited onto a substrate 24.

In contrast to that, FIG. 19 depicts a quantum component 102 comprising thin films 62 with a multi-layer structure of six layers in total, in particular a three layer pattern repeated two times. The three different layers consist, starting from the downmost layer and going up, of a first material 126, the reaction product of a second material and an element of the second reaction atmosphere 118, and a third material 130.

In addition, the quantum component 102 comprises a buffer layer 134 consisting of a buffer material 132 between the substrate 24 and the downmost layer of the thin films 62. As already described with respect to FIG. 15, defects caused by the transition between the substrate 24 and the following thin films 62 can be avoided.

Further, the quantum component 102 comprises a cover layer 138 consisting of a cover material 136 covering and protecting the thin films 62. As already described with respect to FIG. 17, defects caused by external influences, especially reactions with the ambient atmosphere, for instance undesired depositions of further material, can be avoided.

As described in the foregoing a plurality of thin films 62 can be deposited on the substrate surface 48, the various thin films 62 can be made of different materials in order to form multi-layered and multi-material films 62 on the substrate 24.

An element, such as a metal is used for the first material and/or the second material of the first and second source elements 30, 32 in order to form the thin film 62.

To exemplify the technical feasibility of the present invention, FIGS. 20-28 show experimental validations of the technique for $Al_2O_3$ substrates 24 on which Ta and Nb thin films 62 have been grown. Both Ta and Nb are superconducting at several K and are therefore suitable for the fabrication of qubit devices.

FIG. 20 shows the surface diffraction pattern of a $Al_2O_3$ substrate 24 prepared by the method of the present invention, obtained by Reflection High-Energy Electron Diffraction (RHEED). The RHEED beam impinged on the surface 48 with a polar angle of about 2°.

The many spots exemplify a highly ordered two-dimensional crystal surface. The mirror-symmetric pattern of diagonal lines shows that the RHEED beam is aligned along one of the principal crystal axes of the substrate. In this case, the surface reconstruction is rotated by +9° with respect to the bulk lattice. This becomes clear in FIG. 21, where the substrate 24 was rotated by 9° counterclockwise with respect to the RHEED beam, aligning the RHEED beam with the surface reconstruction.

The symmetric pattern of concentric circles without any other observable spots evidences a single surface reconstruction with a single rotation of +9° on the entire substrate surface. The −9° orientation is entirely absent, confirming the feasibility of the method to select one out of several energetically equivalent surface reconstructions according to the present invention.

By changing the pressure of the oxygen process gas to $0.75\times10^{-1}$ hPa, the chemical potential for oxygen atoms to leave the surface 48 is shifted and the minimum-energy configuration of the surface 48 is no longer the single-rotation reconstruction observed for the lower pressure. FIG. 22 shows that in this case, both surface rotation orientations are equally favorable. The RHEED pattern is mirror symmetric, with equal intensity for the left-hand-side and the right-hand-side spots.

FIG. 23 shows the surface morphology of the substrate imaged by RHEED in FIG. 20, after the preparation process. The surface is highly ordered and shows a minimum-energy terrace-and-step structure, with straight terrace edges 66 oriented with an angle of about +25° with respect to the principal crystal axes, which are roughly aligned with the edge of the image.

FIG. 24 shows the height profile extracted along the line in FIG. 23. The terraces of this substrate have a width of about 500 μm and the steps between terraces 58 have a height difference of about 0.43 nm. For $Al_2O_3$, this corresponds to the separation between two Al layers within the bulk $Al_2O_3$ structure. These Al layers correspond to the 'black' layers in the schematic representation of FIGS. 3-8. The surface reconstruction observed in FIG. 20 correspond to an additional 'black' layer on top of the bulk substrate 24.

FIG. 25 shows an AFM image of the surface of a Ta film 62 grown on such a template under ultrapure conditions and at a high surface temperature that allows the long-range displacement of Ta atoms along the surface. The different single crystal domains of the film originally nucleate in different orientations which are, however, constrained by the long-range order of the surface reconstruction of the underlying crystalline surface. They overgrow and possibly incorporate neighboring domains to form large flat single crystalline regions with extremely low defect density and a lateral extension about 40 times their thickness.

The single crystalline nature of the domains is evident from the single atomic steps visible on the surface, and the alignment of the step and domain edges along the axes of the underlying epitaxial template with a sixfold (every) 60° hexagonal symmetry.

FIG. 26 shows a similar SEM image from a film 62 grown under nominally identical conditions, with roughly twice the lateral resolutions as compared to FIG. 25. The growth was stopped, however, after only about ⅕ of the layer thickness compared to FIG. 25. The image therefore represents a snapshot of the process of coalescence between the different, independently nucleated epitaxial grains, now starting to form laterally connected, single crystalline grains of successively larger size.

The X-ray scan shown in FIG. 27 of the same film as in FIG. 25. This measurement averages essentially over the entire sample surface and reveals that the film 62 is perfectly single crystalline within the resolution of the experiment, with the sharp and distinct peaks corresponding to a single family of crystal planes of the Ta oriented parallel to the substrate 24. This result again demonstrates both the very high structural perfection and the complete epitaxial alignment of the film 62 with the substrate 24.

Finally, FIG. 28 shows a cross-sectional SEM image of a layer structure cleaved after deposition, showing a Nb film 62 on a Si substrate 24 without epitaxial alignment, and grown at a substrate temperature of approximately 250° C. The film 62 is not epitaxial, and shows a disordered, columnar structure with a high defect density. According to the invention, this can be avoided by using the high-temperature annealing substrate preparation technique combined with the ultraclean subsequent deposition in a seamlessly integrated in-situ process.

It is also possible to grow layers of compounds as thin films 62. For this purpose a method of forming a layer 62 of a compound having a thickness selected in the range of a monolayer to several μm on a substrate is carried out. As described in the foregoing the substrate 24 could be a single crystal wafer. The substrate 24 is arranged in a process chamber, such as the reaction chamber 10 disclosed in FIGS. 1 and 2, the reaction chamber 10 comprising one or more sources 30, 32 of source material, the method comprising the steps of:

providing a reaction atmosphere in the process chamber 10, the reaction atmosphere comprising a pre-defined process gas G and a reaction chamber pressure;

irradiating the one or more sources 30, 32 with laser light from one of the first and second source heating lasers 36, 38 in order to sublimate and/or evaporate atoms and/or molecules of the source material;

reacting the evaporated atoms and/or molecules with the process gas and forming the layer of the compound on the substrate.

In this context it should be noted that the laser light from the first and second source heating lasers 36, 38 is directed at the surface of the source directly facing the substrate 24.

The reaction chamber pressure is typically selected in the range of $10^{-6}$ to $10^{1}$ hPa. On carrying out the method of forming a compound the step of providing a reaction atmosphere usually comprises an evacuation of the process chamber 10 to a first pressure and then introducing the process gas G to obtain a second pressure, the reaction chamber pressure in the reaction chamber 10.

The first pressure is typically lower than the second pressure and the second pressure is selected in the range of $10^{-11}$ to $10^{-2}$ hPa.

A temperature of at least the shroud and/or of an inner wall of the reaction chamber 10 is temperature controlled to a temperature selected in the range of 77 K to 500 K.

The source material is selected from the group of members consisting of Sc, Ti, V, Cr, Mn, Fe, Co, Ni, Cu, Zn, Zr, Nb, Mo, Ru, Hf, Al, Mg, Ca, Sr, Ba, Y, Rh, Ta, W, Re, Ir, Ga, In, Si, Ge, Sn, Eu, Ce, Pd, Ag, Pt, Au, alloys of the foregoing and combinations of the foregoing.

The laser light irradiating the one or more sources 30, 32 with laser light in order to sublimate and/or evaporate atoms and/or molecules of the source material is focused at the one or more sources 30, 32 with an intensity selected in the range of 1 to 2000 W for a spot size of 1 $mm^2$ and a distance between the one or more sources and the substrate selected in the range of 50 to 120 mm.

The laser light irradiating the one or more sources 30, 32 with laser light having a wavelength in the range of 280 nm to 20 μm, especially in the range of 450 nm to 1.2 μm.

The compound deposited on the substrate can be one of an oxide, a nitride, a hydride, a fluoride, a chloride, a bromide, an iodide, a phosphide, a sulphide, a selenide or a mercury compound.

At higher pressures of the process gas G, the evaporated atoms or molecules suffer more collisions with the gas atoms, leading to a randomization of their direction and kinetic energies. This results in a much smaller fraction of the evaporated atoms or molecules reaching the substrate 24, which, however, may still be useful for forming a layer 62 in some cases, in particular for short working distances and large substrates. The formation of the compound or oxide layer 62 on the substrate 24 under these conditions may take place under several conditions:

growth mode 1: the source material 126 reacts or oxidizes at the source surface and evaporates or sublimates as a compound or oxide. It then deposits as compound or oxide on the substrate.

growth mode 2: the source material 126 evaporates or sublimates without reaction, and reacts with the gas G by collision with gas atoms on its trajectory from the source 30, 32 to the substrate 24 and deposits as compound or oxide.

growth mode 3: the source material 126 evaporates or sublimates without reaction, travels without reaction, and reacts when or after it deposits on the substrate 24 with gas atoms or molecules impinging on the substrate 24.

growth mode 4: any combination of the above.

Of particular interest is a transport reaction in which the source material 126 reacts with the gas G to form a metastable compound with a higher evaporation/sublimation rate than the source material 126 itself. This material further reacts in the gas phase and deposits as the final compound as a thin film 62, or deposits on the substrate 24 and reacts with further gas G to form the final, stable compound as a thin film 62.

Specific examples of compounds are:

$TiO_2$: for $TiO_2$ the source material is Ti, the compound deposited on the substrate is predominantly anatase or rutile $TiO_2$, the laser light has a wavelength selected in the range of 515 to 1070 nm, in particular in the range of 1000 to 1070 nm, with an intensity in the range of 1 to 2000 W corresponding to a power density of 0.001 to 2 $KW/mm^2$ on the source surface, in particular in the range of 100 to 200 W corresponding to a power density of 0.1 to 0.2 $KW/mm^2$, a process gas being a mixture of $O_2$ and $O_3$, in particular with an $O_3$ content of 5 to 10 weight %, with a reaction chamber pressure of $10^{-11}$ to 1 hPa, in particular of $10^{-6}$ to $10^{-2}$ hPa, and a compound layer thickness selected in the range of 0 to 1 μm obtainable within a time period of 0 to 180 min, especially 700 nm within a time period of 15 to 30 min with a working distance of 10 mm to 1 m, in particular 40 to 80 mm and a substrate diameter of 5 to 300 mm, in particular 51 mm.

NiO: for NiO the source material is Ni, the compound deposited on the substrate is predominantly NiO, the laser light has a wavelength selected in the range of 515 to 1070 nm, in particular in the range of 1000 to 1070 nm, with an intensity in the range of 1 to 2000 W corresponding to a power density of 0.001 to 2 $KW/mm^2$ on the source surface, in particular in the range of 100 to 350 W corresponding to a power density of 0.1 to 0.35 $KW/mm^2$, a process gas being a mixture of $O_2$ and $O_3$, in particular with an $O_3$ content of 5 to 10 weight %, with a reaction chamber pressure of $10^{-11}$ to 1 hPa, in particular of $10^{-6}$ to $10^{-2}$ hPa, and a compound layer thickness selected in the range of 0 to 1 μm obtainable within a time period of 0 to 50 min, especially 500 nm within a time period of 10 to 20 min with a working distance of 10 mm to 1 m, in particular 40 to 80 mm and a substrate diameter of 5 to 300 mm, in particular 51 mm.

$Co_3O_4$: for $Co_3O_4$ the source material is Co, the compound deposited on the substrate is predominantly $Co_3O_4$, the laser light has a wavelength selected in the range of 515 to 1070 nm, in particular in the range of 1000 to 1070 nm, with an intensity in the range of 1 to 2000 W corresponding to a power density of 0.001 to 2 $kW/mm^2$ on the source surface, in particular in the range of 100 to 200 W corresponding to a power density of 0.1 to 0.2 $KW/mm^2$, a process gas being a mixture of $O_2$ and $O_3$, in particular with an $O_3$ content of 5 to 10 weight %, with a reaction chamber pressure of $10^{-11}$ to 1 hPa, in particular of $10^{-6}$ to $10^{-2}$ hPa, and a compound layer thickness selected in the range of 0 to 1 μm obtainable within a time period of 0 to 90 min, especially 200 nm within a time period of 10 to 20 min with a working distance of 10 mm to 1 m, in particular 40 to 80 mm and a substrate diameter of 5 to 300 mm, in particular 51 mm.

$Fe_3O_4$: For $Fe_3O_4$ the source material is Fe, the compound deposited on the substrate is predominantly $Fe_3O_4$, the laser light has a wavelength selected in the range of 515 to 1070 nm, in particular in the range of 1000 to 1070 nm, with an intensity in the range of 1 to 2000 W corresponding to a power density of 0.001 to 2 kW/mm$^2$ on the source surface, in particular in the range of 100 to 200 W corresponding to a power density of 0.1 to 0.2 KW/mm$^2$, a process gas being a mixture of $O_2$ and $O_3$, in particular with an $O_3$ content of 5 to 10 weight %, with a reaction chamber pressure of $10^{-11}$ to 1 hPa, in particular of $10^{-6}$ to $10^{-2}$ hPa, and a compound layer thickness selected in the range of 0 to 10 μm obtainable within a time period of 0 to 30 min, especially of 5 μm within a time period of 10 to 20 min with a working distance of 10 mm to 1 m, in particular 40 to 80 mm and a substrate diameter of 5 to 300 mm, in particular 51 mm.

CuO: For CuO the source material is Cu, the compound deposited on the substrate is predominantly CuO, the laser light has a wavelength selected in the range of 500 to 1070 nm, in particular in the range of 500 to 550 nm, with an intensity in the range of 1 to 900 W corresponding to a power density of 0.001 to 0.9 kW/mm$^2$ on the source surface, in particular in the range of 200 to 400 W corresponding to a power density of 0.2 to 0.4 KW/mm$^2$, a process gas being a mixture of $O_2$ and $O_3$, in particular with an $O_3$ content of 5 to 10 weight %, with a reaction chamber pressure of $10^{-11}$ to 1 hPa, in particular of $10^{-6}$ to $10^{-2}$ hPa, and a compound layer thickness selected in the range of 0 to 1 μm obtainable within a time period of 0 to 100 min, especially of 0.15 μm within a time period of 15 to 30 min with a working distance of 10 mm to 1 m, in particular 40 to 80 mm and a substrate diameter of 5 to 300 mm, in particular 51 mm.

Vanadium Oxide: For Vanadium Oxide the source material is V, the compound deposited on the substrate is predominantly $V_2O_3$, $VO_2$ or $V_2O_5$, the laser light has a wavelength selected in the range of 515 to 1100 nm, in particular in the range of 1000 to 1100 nm, with an intensity in the range of 1 to 2000 W corresponding to a power density of 0.001 to 2 KW/mm$^2$ on the source surface, in particular in the range of 60 to 120 W corresponding to a power density of 0.06 to 0.12 KW/mm$^2$, a process gas being a mixture of $O_2$ and $O_3$, in particular with an $O_3$ content of 5 to weight %, with a reaction chamber pressure of $10^{-11}$ to 1 hPa, in particular of $10^{-6}$ to $10^{-2}$ hPa, and a compound layer thickness selected in the range of 0 to 1 μm obtainable within a time period of 0 to 60 min, especially of 0.3 μm within a time period of 10 to 20 min with a working distance of 10 mm to 1 m, in particular to 80 mm and a substrate diameter of 5 to 300 mm, in particular 51 mm.

$Nb_2O_5$: For $Nb_2O_5$ the source material is Nb, the compound deposited on the substrate is predominantly $Nb_2O_5$, the laser light has a wavelength selected in the range of 515 to 1100 nm, in particular in the range of 1000 to 1100 nm, with an intensity in the range of 1 to 2000 W corresponding to a power density of 0.001 to 2 kW/mm$^2$ on the source surface, in particular in the range of 200 to 400 W corresponding to a power density of 0.2 to 0.4 KW/mm$^2$, a process gas being a mixture of $O_2$ and $O_3$, in particular with an $O_3$ content of 5 to 10 weight %, with a reaction chamber pressure of $10^{-11}$ to 1 hPa, in particular of $10^{-6}$ to $10^{-2}$ hPa, and a compound layer thickness selected in the range of 0 to 2 μm obtainable within a time period of 0 to 20 min, especially of 1.4 μm within a time period of 10 to 20 min with a working distance of 10 mm to 1 m, in particular 40 to 80 mm and a substrate diameter of 5 to 300 mm, in particular 51 mm.

$Cr_2O_3$: For $Cr_2O_3$ the source material is Cr, the compound deposited on the substrate is predominantly $Cr_2O_3$, the laser light has a wavelength selected in the range of 515 to 1100 nm, in particular in the range of 1000 to 1100 nm, with an intensity in the range of 1 to 2000 W corresponding to a power density of 0.001 to 2 kW/mm$^2$ on the source surface, in particular in the range of 20 to 80 W corresponding to a power density of 0.02 to 0.08 kW/mm$^2$, a process gas being a mixture of $O_2$ and $O_3$, in particular with an $O_3$ content of 5 to 10 weight %, with a reaction chamber pressure of $10^{-11}$ to 1 hPa, in particular of $10^{-6}$ to $10^{-2}$ hPa, and a compound layer thickness selected in the range of 0 to 1 μm obtainable within a time period of 0 to 30 min, especially of 0.5 μm within a time period of 10 to 20 min with a working distance of 10 mm to 1 m, in particular 40 to 80 mm and a substrate diameter of 5 to 300 mm, in particular 51 mm.

$RuO_2$: For $RuO_2$ the source material is Ru, the compound deposited on the substrate is predominantly $RuO_2$, the laser light has a wavelength selected in the range of 515 to 1100 nm, in particular in the range of 1000 to 1100 nm, with an intensity in the range of 1 to 2000 W corresponding to a power density of 0.001 to 2 kW/mm$^2$ on the source surface, in particular in the range of 200 to 600 W corresponding to a power density of 0.2 to 0.6 KW/mm$^2$, a process gas being a mixture of $O_2$ and $O_3$, in particular with an $O_3$ content of 5 to 10 weight %, with a reaction chamber pressure of $10^{-11}$ to 1 hPa, in particular of $10^{-6}$ to $10^{-2}$ hPa, and a compound layer thickness selected in the range of 0 to 1 μm obtainable within a time period of 0 to 300 min, especially of 0.06 μm within a time period of 10 to 20 min with a working distance of 10 mm to 1 m, in particular 40 to 80 mm and a substrate diameter of 5 to 300 mm, in particular 51 mm.

ZnO: For ZnO the source material is Zn, the compound deposited on the substrate is predominantly ZnO, the laser light has a wavelength selected in the range of 515 to 1100 nm, in particular in the range of 1000 to 1100 nm, with an intensity in the range of 1 to 2000 W corresponding to a power density of 0.001 to 2 kW/mm$^2$ on the source surface, in particular in the range of 5 to 10 W corresponding to a power density of 0.005 to 0.010 KW/mm$^2$, a process gas being a mixture of $O_2$ and $O_3$, in particular with an $O_3$ content of 5 to 10 weight %, with a reaction chamber pressure of $10^{-11}$ to 1 hPa, in particular of $10^{-6}$ to $10^{-2}$ hPa, and a compound layer thickness selected in the range of 0 to 1 μm obtainable within a time period of 0 to 20 min, especially of 1.4 μm within a time period of 10 to 20 min with a working distance of 10 mm to 1 m, in particular 40 to 80 mm and a substrate diameter of 5 to 300 mm, in particular 51 mm.

MnO: For MnO the source material is Mn, the compound deposited on the substrate is predominantly MnO, the laser light has a wavelength selected in the range of 515 to 1100 nm, in particular in the range of 1000 to 1100 nm, with an intensity in the range of 1 to 2000 W corresponding to a power density of 0.001 to 2 KW/mm$^2$ on the source surface, in particular in the range of 5 to 10 W corresponding to a power density of 0.005 to 0.010 KW/mm$^2$, a process gas being a mixture of $O_2$ and $O_3$, in particular with an $O_3$ content of 5 to 10 weight %, with a reaction chamber pressure of $10^{-11}$ to 1 hPa, in particular of $10^{-6}$ to $10^{-2}$ hPa, and a compound layer thickness selected in the range of 0 to 1 μm obtainable within a time period of 0 to 20 min, especially of 1.4 μm within a time period of 10 to 20 min with a working distance of 10 mm to 1 m, in particular 40 to 80 mm and a substrate diameter of 5 to 300 mm, in particular 51 mm.

$Sc_2O_3$: For $Sc_2O_3$ the source material is Sc, the compound deposited on the substrate is predominantly $Sc_2O_3$, the laser light has a wavelength selected in the range of 515 to 1100 nm, in particular in the range of 1000 to 1100 nm, with an intensity in the range of 1 to 2000 W corresponding to a power density of 0.001 to 2 kW/$mm^2$ on the source surface, in particular in the range of 20 to 50 W corresponding to a power density of 0.02 to 0.05 KW/$mm^2$, a process gas being a mixture of $O_2$ and $O_3$, in particular with an $O_3$ content of 5 to 10 weight %, with a reaction chamber pressure of $10^{-11}$ to 1 hPa, in particular of $10^{-6}$ to $10^{-2}$ hPa, and a compound layer thickness selected in the range of 0 to 1 μm obtainable within a time period of 0 to 20 min, especially of 1.3 μm within a time period of 10 to 20 min with a working distance of 10 mm to 1 m, in particular 40 to 80 mm and a substrate diameter of 5 to 300 mm, in particular 51 mm.

$Mo_4O_{11}$ or $MoO_3$: For $Mo_4O_{11}$ or $MoO_3$ the source material is Mo, the compound deposited on the substrate is predominantly $Mo_4O_{11}$ or $MoO_3$, the laser light has a wavelength selected in the range of 515 to 1100 nm, in particular in the range of 1000 to 1100 nm, with an intensity in the range of 1 to 2000 W corresponding to a power density of 0.001 to 2 KW/$mm^2$ on the source surface, in particular in the range of 400 to 800 W corresponding to a power density of 0.4 to 0.8 KW/$mm^2$, a process gas being a mixture of $O_2$ and $O_3$, in particular with an $O_3$ content of 5 to weight %, with a reaction chamber pressure of $10^{-11}$ to 1 hPa, in particular of $10^{-6}$ to $10^{-2}$ hPa, and a compound layer thickness selected in the range of 0 to 4 μm obtainable within a time period of 0 to 30 min, especially of 4.0 μm within a time period of 10 to 20 min with a working distance of 10 mm to 1 m, in particular to 80 mm and a substrate diameter of 5 to 300 mm, in particular 51 mm.

$ZrO_2$: For $ZrO_2$ the source material is Zr, the compound deposited on the substrate is predominantly $ZrO_2$, the laser light has a wavelength selected in the range of 515 to 1100 nm, in particular in the range of 1000 to 1100 nm, with an intensity in the range of 1 to 2000 W corresponding to a power density of 0.001 to 2 KW/$mm^2$ on the source surface, in particular in the range of 300 to 500 W corresponding to a power density of 0.3 to 0.5 KW/$mm^2$, a process gas being a mixture of $O_2$ and $O_3$, in particular with an $O_3$ content of 5 to 10 weight %, with a reaction chamber pressure of $10^{-11}$ to 1 hPa, in particular of $10^{-6}$ to $10^{-2}$ hPa, and a compound layer thickness selected in the range of 0 to 1 μm obtainable within a time period of 0 to 100 min, especially of 0.2 μm within a time period of 15 to 25 min with a working distance of 10 mm to 1 m, in particular 40 to 80 mm and a substrate diameter of 5 to 300 mm, in particular 51 mm.

$HfO_2$: For $HfO_2$ the source material is Hf, the compound deposited on the substrate is predominantly $HfO_2$, the laser light has a wavelength selected in the range of 515 to 1100 nm, in particular in the range of 1000 to 1100 nm, with an intensity in the range of 1 to 2000 W corresponding to a power density of 0.001 to 2 kW/$mm^2$ on the source surface, in particular in the range of 250 to 400 W corresponding to a power density of 0.25 to 0.4 KW/$mm^2$, a process gas being a mixture of $O_2$ and $O_3$, in particular with an $O_3$ content of 5 to 10 weight %, with a reaction chamber pressure of $10^{-11}$ to 1 hPa, in particular of $10^{-6}$ to $10^{-2}$ hPa, and a compound layer thickness selected in the range of 0 to 1 μm obtainable within a time period of 0 to 40 min, especially of 0.6 μm within a time period of 15 to 25 min with a working distance of 10 mm to 1 m, in particular 40 to 80 mm and a substrate diameter of 5 to 300 mm, in particular 51 mm.

$Al_2O_3$: For $Al_2O_3$ the source material is Al, the compound deposited on the substrate is predominantly $Al_2O_3$, the laser light has a wavelength selected in the range of 515 to 1100 nm, in particular in the range of 1000 to 1100 nm, with an intensity in the range of 1 to 2000 W corresponding to a power density of 0.001 to 2 kW/$mm^2$ on the source surface, in particular in the range of 200 to 400 W corresponding to a power density of 0.2 to 0.4 KW/$mm^2$, a process gas being a mixture of $O_2$ and $O_3$, in particular with an $O_3$ content of 5 to 10 weight %, with a reaction chamber pressure of $10^{-11}$ to 1 hPa, in particular of $10^{-6}$ to $10^{-2}$ hPa, and a compound layer thickness selected in the range of 0 to 1 μm obtainable within a time period of 0 to 20 min, especially of 1.0 μm within a time period of 15 to 25 min with a working distance of 10 mm to 1 m, in particular 40 to 80 mm and a substrate diameter of 5 to 300 mm, in particular 51 mm. For Al, higher growth rates of more than 1 μm per minute are achievable due to growth mode 4 with laser powers of 300 to 500 W.

Thermal laser evaporation (TLE) is a particularly promising technique for the growth of metal films. Here, we demonstrate that thermal laser evaporation is also suitable for the growth of amorphous and polycrystalline oxide films. We report on a spectrum of binary oxide films that have been deposited by laser-induced evaporation of elemental metal sources in oxygen-ozone atmospheres. The oxide deposition by TLE is accompanied by an oxidation of the elemental metal source, which systematically affects the source molecular flux. Fifteen elemental metals were successfully used as sources for oxide films grown on unheated substrates, employing one and the same laser optic. The source materials ranged from refractory metals with low vapor pressures, such as Hf, Mo, and Ru, to Zn, which readily sublimates at low temperatures. These results reveal that TLE is well suited for the growth of ultraclean oxide films.

Oxide films 62 are of great interest for realizing new functionalities due to their broad spectrum of intriguing and useful properties. Virtually all deposition techniques are used for the growth of oxide films, including electron-beam evaporation (EBE), molecular beam epitaxy (MBE), pulsed laser deposition (PLD), sputtering, and atomic layer deposition (ALD). Thermal laser evaporation (TLE) has recently been demonstrated to be a promising technique for growing ultraclean metal films because it combines the advantages of MBE, PLD, and EBE by thermally evaporating metallic sources with a laser beam.

By utilizing the adsorption-controlled growth mode, MBE is particularly suited for growing films of superior structural quality. In MBE, molecular fluxes of source materials are generated by evaporating the source materials. However, ohmic heaters, which are preferred for this purpose, limit the use of reactive background gases. This restriction can be critical for the growth of complex metal oxides. Furthermore, elements with low vapor pressure, such as B, C, Ru, Ir, and W, cannot be evaporated by external ohmic heating. To evaporate those elements requires EBE, but that technique is not optimal for achieving precise and stable evaporation rates. PLD transfers a source material onto a substrate via short-period, high-power laser pulses. Although PLD can operate with a high background pressure of reactive gases, the precise control of the material composition is challenging, in particular if the film composition is to be varied smoothly.

Laser-assisted evaporation had been proposed and attempted for the thin film deposition after the invention of laser. However, the evaporation by continuous-wave (cw) laser was abandoned due to the formation of nonstoichiometric films, while the evaporation by high-power density pulsed laser led to the invention of PLD. Along with the development of cw laser technology, TLE has been recently rediscovered as a candidate for epitaxial growth of complex materials, which can combine the advantages of MBE, PLD, and EBE while eliminating their respective weaknesses. Lasers 36, 38 placed outside the vacuum chamber 12 evaporate pure metal sources 30, 32 by local heating, which requires only a simple setup and allows the precise evaporation control of each source element, high purity of the source materials, and the almost unlimited choice of background gas G composition and pressure. In many cases, the locally molten source 30, 32 forms its own crucible. By avoiding impurity incorporation from the crucible, the source 30, 32 is guaranteed to remain highly pure. The potential of TLE to deposit elemental metallic and semiconducting films 62 has been realized by the deposition of a wide range of elements as films 62, ranging from high-vapor-pressure elements such as Bi and Zn to low-vapor-pressure elements such as W and Ta.

Whereas using TLE to grow oxide films 62 and heterostructures may also be highly advantageous, it is not obvious that it is possible in an oxidizing atmosphere. Oxidation of the heat source (filament), which plagues MBE and EBE, is trivial to avoid in TLE. However, the metal sources 30, 32 themselves are prone to oxidation when heated by a laser beam in an oxidizing atmosphere. If the source oxidizes, the laser radiation is no longer absorbed only by the original source material but also by its oxide. Indeed, the entire source or the surface of the source may oxidize, or the oxide may form a partial layer floating on a melt pool. In addition, the molecular fluxes of the source materials may be generated by both the metallic part of source and by the source material oxide.

To do so, we performed a series of evaporation experiments in which elemental metal sources 30, 32 having high or low vapor pressures were evaporated by laser irradiation in a variety of oxygen-ozone atmospheres. For simplicity in exploring the evaporation process, we used substrates 24 of unheated Si (100) wafers coated by their native oxide. We readily succeeded in growing oxide films 62, using the same laser optics and laser wavelengths of 1030-1070 nm for every element explored as the first and second source heating lasers 36, 38. Our experiments reveal that the evaporation of elemental sources in strongly oxidizing atmospheres is applicable for oxide film growth despite the oxidation of the source 30, 32 during the process. We also find that different oxide phases are obtainable in a given atmosphere by tuning the oxidizing atmosphere. The deposition process is furthermore found to display a characteristic variation as a function of the oxygen-ozone pressure.

A schematic of the TLE chamber 10 used in this study is shown in FIG. 1. Separated by a 60-mm working distance, a high-purity cylindrical metal source 30, 32 and the 2-inch Si (100) substrate 24 are supported by Ta-based holders 22. We used a 1030-nm fiber-coupled disk laser 36 and a 1070-nm fiber laser 38 incident at 45° at the top surface to heat the sources 30, 32. As determined by the availability of these lasers 36, 38, we used the former laser 36 to evaporate Ti, Co, Fe, Cu and Ni, and the latter 38 for the other elements. No difference in the performance of the two lasers 36, 38 was noted. Both lasers 36, 38 illuminated approximately elliptical areas of ~1 $mm^2$ on the sources 30, 32. For temperature sensing, we positioned type C W—Re thermocouples on the backside of the Si wafers 24 and at the bottom of the sources 30, 32.

A flowing oxygen-ozone mixture 20 and a cascaded pumping system 18 comprising two turbomolecular pumps and a diaphragm pump connected in series was employed for the precise control of the chamber pressure $P_{ox}$, which was varied between $<10^{-8}$ and $10^{-2}$ hPa. Ozone accounted for approximately 10 wt % of the total flow provided by the glow-discharge continuous-flow ozone generator (not shown). The setting of the valve controlling this gas flow was held constant during each deposition to provide a constant flow. During the evaporation process, $P_{ox}$ and the temperatures of source 30, 32 and substrate 24 were monitored by pressure gauges and the thermocouples (not shown). Using the same deposition geometry, we used TLE to evaporate fifteen different metal elements to deposit oxide films 62. Each element was evaporated in several runs using the same laser power and laser optics but different values of $P_{ox}$ ranging from $10^{-8}$ to $10^{-2}$ hPa. Scanning electron microscopy (SEM) was employed to measure the film thickness and to study its microstructure. The crystal structures of the deposited films 62 were identified by x-ray diffraction. Photoemission spectroscopy was performed to reveal the oxidation states of the TLE-grown $TiO_2$ films 62. If a film 62 was found to be amorphous, it was later subjected to an additional two-hour Ar anneal at 500° C. for crystallization.

Owing to the consumption of the oxygen-ozone gas mixture caused by oxidation of the source 30, 32 and the evaporated material, $P_{ox}$ frequently decreased during deposition, as illustrated by FIG. 29. This figure shows $P_{ox}$ during the evaporation of Ti at several gas pressures. The laser irradiation time for TLE of Ti is 15 minutes. $P_{ox}$ decreases as the laser 36, 38 is turned on at time of ~300 sec, and it quickly returns to the initial background value for higher pressures as the laser is turned off at ~1200 sec. Oxidation is more active at the higher temperatures, therefore, the decrease of $P_{ox}$ can be predominantly attributed to the oxidation of the elemental source. The maximum amount of oxygen required to oxidize the evaporated material is less than 1% of the inlet gas flow, which cannot account for the observed pressure change. After deposition at $10^{-2}$ hPa with 160 W laser, the Ti source 30, 32 is covered by a white substance, which most probably consists of $TiO_2$. Other elemental sources are also oxidized after use. This substantial oxidation of the sources 30, 32, to which we referred in the introduction, affects the absorption of the laser light, the evaporation process, and the vapor species deposited on the substrates 24.

However, the decrease of the background pressure is not observed in all instances. The pressure change is small or even absent in two cases: first, if the source 30, 32 has already been fully oxidized at the beginning of the process; second, if the oxidation of the source 30, 32 is intrinsically unfavorable. The thermal laser evaporation of Ni in the oxidizing atmosphere is an example of the first case. A decrease of $P_{ox}$ is observed only for $P_{ox}<10^{-4}$ hPa. At higher pressure, the Ni source 30, 32 becomes covered by its oxide. Further oxidation is therefore suppressed, and the decrease of $P_{ox}$ disappears. The predominant vapor species obtained by heating Ni under strongly oxidizing conditions is therefore provided by NiO. The thermal laser evaporation of Cu is an example of the second case, as the oxidation of Cu is relatively unfavorable. Above 1000° C. and in an oxygen pressure range of $10^{-4}$-$10^{-2}$ hPa, metallic Cu is more stable than its oxides. In the experiment, the source temperature in the irradiated area exceeds 1085° C., as is evident from the fact that the Cu is locally molten. At this temperature, liquid Cu is the thermodynamically stable phase, and elemental Cu is expected to provide the dominant vapor species. Indeed, no significant change of the chamber pressure occurs during the evaporation of Cu as shown in Figure S3. In agreement, the laser-irradiated area of a Cu source 30, 32 is metallic after the TLE process.

We have tested fifteen metallic elements as sources for the TLE growth of oxide films (Table 1). FIG. 30 shows the grazing-incidence XRD patterns of TLE-grown $TiO_2$, $Fe_3O_4$, $HfO_2$, $V_2O_3$, NiO, and $Nb_2O_5$ films. These patterns are typical for all binary oxides investigated here. As shown, the films 62 are polycrystalline and, in many cases, single-phase. Most elements provided polycrystalline films 62 on the unheated Si substrates 24 except for Cr, which formed an amorphous oxide. A subsequent two-hour 500° C. Ar anneal transformed this layer into a polycrystalline $Cr_2O_3$ film 62. Table 1 summarizes the observed oxide phases. The Ti, V, and Mo oxides formed several phases, with $P_{ox}$ determining which phase was obtained. In the case of V, for example, $V_2O_3$, $VO_2$, or $V_2O_5$ films 62 are obtained by increasing $P_{ox}$ from $10^{-4}$ to $10^{-2}$ hPa. For the other elements, we observed only a single oxidation state within the $P_{ox}$ range used.

To investigate the structure of the films 62 in more detail, we performed cross-sectional SEM. As shown in FIG. 31, which displays the SEM cross sections of the films 62 of FIG. 30, most of the polycrystalline films have a columnar structure. The ratio between the measured substrate temperature and the melting point of the deposited oxide ranges from 0.05 to 0.2. The observed columnar structure is therefore consistent with the zone model of film growth, which for the conditions used here predicts the formation of a columnar microstructure. The crystal structure of the deposited oxide nevertheless affects the film structure. Mo oxide films grown at $10^{-3}$ and $10^{-2}$ hPa comprise prismatic and hexagonal plates, respectively. The films 62 shown in FIG. 31 were grown at rates of several Å/s; these rates were chosen as typical for the growth of oxide films. The rates (see FIG. 31) were measured by dividing the film thickness at the wafer center by the laser irradiation time. The deposition rates are not limited to the values presented. Indeed, they increase super-linearly with laser power.

As the source 30,32 is heated locally, it behaves like a flat, small-area evaporation source 30, 32, providing as function of emission angle a cosine-type flux distribution. Indeed, SEM measurements show that the films 62 are thinner towards the wafer edge. With the evaporation parameters we used, the reduction of the film thickness towards the edge equals ~20% in most cases, slightly higher than the theoretically expected value of ~15%. We attribute this effect to the notable pitting of the source during evaporation, which concentrates the molecular flux.

Our studies show that, as expected, the phase of the deposited oxide is a function of the oxidizing gas pressure. This behavior is illustrated for Ti and Ni films 62 in FIG. 32. This figure provides the XRD patterns of such films grown in several different $P_{ox}$. In the case of Ti, polycrystalline hexagonal Ti films are obtained if the deposition is made without oxygen-ozone. With increasing $P_{ox}$, sub-stoichiometric TiO, rutile $TiO_2$, and anatase $TiO_2$ films 62 are deposited. TiO is a well-known volatile suboxide of Ti. It was formed in a weakly oxidizing environment with $P_{ox}$~$10^{-6}$ hPa. The peaks at 37.36°, 43.50°, and 63.18° (FIG. 5*a*, red curve) indicate cubic TiO. Rutile $TiO_2$ appears in the film for $P_{ox}$~$10^{-4}$ hPa. Gray lines mark the expected diffraction peak positions of rutile $TiO_2$. At $10^3$ hPa, anatase $TiO_2$ is generated together with the rutile phase as marked by the purple stars in FIG. 5. Owing to its low surface free energy, the metastable $TiO_2$ anatase phase is preferably obtained by most synthesis and deposition methods. High-energy conditions are usually required to transform the anatase phase to the rutile phase or to synthesize rutile-phase $TiO_2$ directly. We observe the preferential formation of rutile-phase $TiO_2$, although, given by the thermal energies of the evaporated atoms and molecules, TLE is a low-energy process. At $10^{-2}$ hPa, the deposited films lose their crystallinity.

The oxidation states of the TLE-grown $TiO_2$ films 62 were analyzed by XPS and compared to $TiO_2$ films grown by EBE. Whereas the as-deposited EBE sample comprises a significant amount of $Ti^{3+}$, TLE samples contain mostly $Ti^{4+}$. We attribute this phenomenon to the oxygen-ozone background, which suppresses the thermal dissociation of $TiO_2$, $TiO_2(s)\rightarrow TiO(g)+\frac{1}{2}O_2(g)$, and oxidizes the deposited material.

Interestingly, we have found that the oxidation behavior of TLE-grown Ni oxide films 62 differs markedly from that of Ti oxide films 62. Under UHV conditions, a cubic phase is found also for metallic Ni (FIG. 32*b*). Although the Ni source surface is oxidized at $P_{ox}$~$10^{-6}$ hPa (as evidenced in a decrease of the chamber pressure), the obtained films 62 show metallic behavior also at this $P_{ox}$. We attribute this to the high oxidation potential of Ni and to Ni having a higher vapor pressure than NiO. The majority vapor species therefore originates from unoxidized Ni in the irradiated hot area. Furthermore, the Ni deposited on the substrate 24 does not oxidize significantly at the low substrate temperature. The NiO phase evolves gradually with increasing $P_{ox}$. The diffraction peak positions expected for the NiO phase are present in FIG. 32, showing the formation of cubic NiO. As evidenced by the presence of both metal and oxide peaks, the Ni film 62 deposited at $10^{-5}$ hPa is partially oxidized to NIO. The NiO phase dominates at higher $P_{ox}$.

$P_{ox}$ also affects the deposition rate of TLE-grown oxide films 62. FIG. 33 shows the pressure dependence of the deposition rates of Ti- and Ni-based oxide films 62. Considering the oxygen incorporation into the film 62, we would expect an increasing deposition rate with increasing $P_{ox}$. However, the observed deposition rate behavior cannot be explained only by oxygen incorporation alone. The growth rate of the Ti-based films 62 increases with $P_{ox}$ from ~0.6 Å/s at base pressure to 3.5 Å/s at $10^{-3}$ hPa. A six-fold increase in deposition rate infers that there are other factors affecting the rate. In contrast, the deposition rate of Ni-based oxide films 62 increases only from 3.1 to 4.6 Å/s at $10^{-4}$ hPa, then drops drastically to 0.3 Å/s for $P_{ox}$>$10^{-4}$ hPa. An increase of the oxide fraction in the film 62 (see FIG. 32) may be responsible for the initial increase of deposition rate, but cannot explain the huge decrease of deposition rate at $10^{-3}$ hPa. The growth properties of Ti- and Ni-based films 62 represent two characteristic modes observed for most of the films 62. Fe, Co, Nb, Zn, and Mo show the behavior of Ti, whereas Cr, Sc, Mn, and V show that of Ni.

Why does $P_{ox}$ alter the deposition rate of oxide films grown by TLE in these two rather characteristic ways? We suggest that this behavior is controlled by the vapor pressure of the source's 30, 32 oxidized surface layer. The deposition rate increases with $P_{ox}$ if the vapor pressure of the oxide formed at the source surface exceeds that of the metal. This corresponds to the Ti-like deposition rate behavior. Formation of $TiO_2$ gas vapor, $Ti(s)+O_2(g)\rightarrow TiO_2(g)$, is an exothermic reaction leading to effective generation of oxide vapor from the source. As the metal oxidation rate increases with a power of $P_{ox}$ (oxidation rate $$\propto P_{ox}^n),$$

the deposition rate will increase correspondingly with $P_{ox}$, as observed for Fe and Nb. In contrast, the Ni-like scenario is found if the vapor pressure of the metal exceeds that of the oxide. As the vapor pressure of NiO is about one order of magnitude smaller than that of Ni, a NiO coverage of a source reduces the deposition rate by the same factor. This understanding is supported by the observation that the abrupt decrease of the deposition rate of Ni occurs at $10^{-3}$ hPa, the same pressure at which the pressure drop in the chamber disappears, revealing that the source is passivated by a NiO layer 62 at this $P_{ox}$.

The growth of polycrystalline oxide films 62 by TLE has thus been demonstrated. The films 62 having tunable oxidation states and a crystal structure can be grown by evaporating pure metal sources in oxygen-ozone pressures of up to $10^1$ hPa, irrespective of possible oxidation of the sources 30, 32. From a wide range of metal sources comprising low and high-vapor-pressure elements, polycrystalline films 62 in various oxidation states were deposited with growth rates of several Å/s on unheated Si (100) substrates 24. Determining the degree of source oxidation, the pressure of the oxidizing gas strongly affects the deposition rate as well as the composition and phase of the resulting oxide films 32. Our work paves the way to TLE growth of epitaxial oxide heterostructures of ultrahigh purity for diverse compounds.

TABLE 1

List of the oxide thin films deposited by TLE in this work.

| Elemental source | Film |
|---|---|
| Sc | $Sc_2O_3$ |
| Ti | TiO, $TiO_2$* |
| V | $V_2O_3$, $VO_2$, $V_2O_5$ |
| Cr | $Cr_2O_3$** |
| Mn | MnO |
| Fe | $Fe_3O_4$ |
| Co | $Co_3O_4$ |
| Ni | NiO |
| Cu | CuO |
| Zn | ZnO |
| Zr | $ZrO_2$ |
| Nb | $Nb_2O_5$ |
| Mo | $Mo_4O_{11}$, $MoO_3$ |
| Hf | $HfO_2$ |
| Ru | $RuO_2$ |

*Both anatase and rutile phases were observed.
**Film was annealed at 500° C. for 2 hours in Ar ambient.

LIST OF REFERENCE NUMERALS

10 reaction chamber
12 vacuum chamber
14 first reaction volume
16 second reaction volume
18 vacuum pump
20 gas supply
22 substrate arrangement
24 substrate
26 substrate heating laser
28 substrate holder transfer
30 first source
32 second source
34 source arrangement
36 first source heating laser
38 second source heating laser
40 shielding aperture
42 source holder transfer
44 gate valve
46 substrate holder
48 substrate surface of 24
50 backside of 24
52 window
54 first element, molecule, formula unit
56 second element, molecule, formula unit
58 terrace
60 surface
62 thin film, layer
66 edges
100 solid-state component
102 quantum component
104 first electromagnetic radiation
106 second electromagnetic radiation
108 third electromagnetic radiation
110 fourth electromagnetic radiation
112 fifth electromagnetic radiation
114 component beam
116 first reaction atmosphere
118 second reaction atmosphere
120 third reaction atmosphere
122 fourth reaction atmosphere
124 fifth reaction atmosphere
126 first material
128 second material
130 third material
132 buffer material
134 buffer layer
136 cover material
138 cover layer
G process gas
T Termination material

What is claimed is:

1. A method of forming a layer of a compound having a thickness selected in the range of a monolayer to several mm on a substrate, the substrate being arranged in a process chamber comprising one or more sources of source material, the method comprising the steps of:

providing a reaction atmosphere in the process chamber, the reaction atmosphere comprising a process gas and a reaction chamber pressure;

irradiating the one or more sources with laser light in order to melt and/or sublimate and/or evaporate atoms and/or molecules of the source material present at least at a surface of the one or more sources;

reacting the melted and/or sublimated and/or evaporated atoms and/or molecules with the process gas in the process chamber; and forming the layer of the compound on the substrate;

wherein a temperature of an inner wall of the reaction chamber is temperature controlled to a temperature selected in the range of 77 K to 500 K;

wherein the source material is Ti, the compound deposited on the substrate is predominantly anatase or rutile $TiO_2$, the laser light has a wavelength selected in the range of 515 to 1070 nm with an intensity in the range of 1 to 2000 W corresponding to a power density of 0.001 to 2 $kW/mm^2$ on the source surface, a process gas being a mixture of $O_2$ and $O_3$, with a reaction chamber pressure of $10^{-11}$ to 1 hPa and a compound layer thickness selected in the range of 0 to 1 μm obtainable within a time period of 0 to 180 min, with a working distance of 10 mm to 1 m, and a substrate diameter of 5 to 300 mm;

or wherein the source material is Ni, the compound deposited on the substrate is predominantly NiO, the laser light has a wavelength selected in the range of 515 to 1070 nm with an intensity in the range of 1 to 2000 W corresponding to a power density of 0.001 to 2 kW/mm2 on the source surface a process gas being a mixture of $O_2$ and $O_3$ with a reaction chamber pressure of $10^{-11}$ to 1 hPa, and a compound layer thickness selected in the range of 0 to 1 pm obtainable within a time period of 0 to 50 min, with a working distance of 10 mm to 1 m, and a substrate diameter of 5 to 300 mm;

or wherein the source material is Co, the compound deposited on the substrate is predominantly $Co_3O_4$, the laser light has a wavelength selected in the range of 515 to 1070 nm with an intensity in the range of 1 to 2000 W corresponding to a power density of 0.001 to 2 kW/mm$^2$ on the source surface, a process gas being a mixture of $O_2$ and $O_3$, with a reaction chamber pressure of $10^{-11}$ to 1 hPa, and a compound layer thickness selected in the range of 0 to 1 μm obtainable within a time period of 0 to 90 min, with a working distance of 10 mm to 1 m, and a substrate diameter of 5 to 300 mm;

or wherein the source material is Fe, the compound deposited on the substrate is predominantly $Fe_3O_4$, the laser light has a wavelength selected in the range of 515 to 1070 nm with an intensity in the range of 1 to 2000 W corresponding to a power density of 0.001 to 2 kW/mm$^2$ on the source surface, a process gas being a mixture of $O_2$ and $O_3$, with a reaction chamber pressure of $10^{-11}$ to 1 hPa, and a compound layer thickness selected in the range of 0 to 10 μm obtainable within a time period of 0 to 30 min, with a working distance of 10 mm to 1 m, and a substrate diameter of 5 to 300 mm;

or wherein the source material is Cu, the compound deposited on the substrate is predominantly CuO, the laser light has a wavelength selected in the range of 515 to 1070 nm with an intensity in the range of 1 to 2000 W corresponding to a power density of 0.001 to 2 kW/mm$^2$ on the source surface, a process gas being a mixture of $O_2$ and $O_3$, with a reaction chamber pressure of $10^{-11}$ to 1 hPa, and a compound layer thickness selected in the range of 0 to 1 μm obtainable within a time period of 0 to 100 min, with a working distance of 10 mm to 1 m, and a substrate diameter of 5 to 300 mm;

or wherein the source material is V, the compound deposited on the substrate is predominantly $V_2O_3$, $VO_2$ or $V_2O_5$, the laser light has a wavelength selected in the range of 515 to 1100 nm with an intensity in the range of 1 to 2000 W corresponding to a power density of 0.001 to 2 kW/mm$^2$ on the source surface, a process gas being a mixture of $O_2$ and $O_3$, with a reaction chamber pressure of $10-^{11}$ to 1 hPa, and a compound layer thickness selected in the range of 0 to 1 μm obtainable within a time period of 0 to 60 min, with a working distance of 10 mm to 1 m, and a substrate diameter of 5 to 300 mm;

or wherein the source material is Nb, the compound deposited on the substrate is predominantly $Nb_2O_5$, the laser light has a wavelength selected in the range of 515 to 1100 nm with an intensity in the range of 1 to 2000 W corresponding to a power density of 0.001 to 2 kW/mm$^2$ on the source surface, a process gas being a mixture of $O_2$ and $O_3$, with a reaction chamber pressure of $10-^{11}$ to 1 hPa and a compound layer thickness selected in the range of 0 to 2 μm obtainable within a time period of 0 to 20 min, with a working distance of 10 mm to 1 m, in particular 40 to 80 mm and a substrate diameter of 5 to 300 mm;

or wherein the source material is Cr, the compound deposited on the substrate is predominantly $Cr_2O_3$, the laser light has a wavelength selected in the range of 515 to 1100 nm with an intensity in the range of 1 to 2000W corresponding to a power density of 0.001 2 kW/mm$^2$ on the source surface, a process gas being a mixture of $O_2$ and $O_3$, with a reaction chamber pressure of $10-^{11}$ to 1 hPa, and a compound layer thickness selected in the range of 0 to 1 μm obtainable within a time period of 0 to 30 min, with a working distance of 10 mm to 1 m, and a substrate diameter of 5 to 300 mm;

or wherein the source material is Ru, the compound deposited on the substrate is predominantly $RuO_2$, the laser light has a wavelength selected in the range of 515 to 1100 nm with an intensity in the range of 1 to 2000 W corresponding to a power density of 0.001 to 2 kW/mm$^2$ on the source surface, a process gas being a mixture of $O_2$ and $O_3$with a reaction chamber pressure of $10-^{11}$ to 1 hPa, and a compound layer thickness selected in the range of 0 to 1 μm obtainable within a time period of 0 to 30 min, with a working distance of 10 mm to 1 m, and a substrate diameter of 5 to 300 mm;

or wherein the source material is Zn, the compound deposited on the substrate is predominantly ZnO, the laser light has a wavelength selected in the range of 515 to 1100 nm with an intensity in the range of 1 to 2000 W corresponding to a power density of 0.001 to 2 kW/mm$^2$ on the source surface, a process gas being a mixture of $O_2$ and $O_3$, with a reaction chamber pressure of $10-^{11}$ to 1 hPa, and a compound layer thickness selected in the range of 0 to 1 μm obtainable within a time period of 0 to 20 min, with a working distance of 10 mm to 1 m, and a substrate diameter of 5 to 300 mm;

or wherein the source material is Mn, the compound deposited on the substrate is predominantly MnO, the laser light has a wavelength selected in the range of 515 to 1100 nm with an intensity in the range of 1 to 2000 W corresponding to a power density of 0.001 2 kW/mm$^2$ on the source surface, a process gas being a mixture of $O_2$ and $O_3$, with a reaction chamber pressure of $10-^{11}$ to 1 hPa, and a compound layer thickness selected in the range of 0 to 1 μm obtainable within a time period of 0 to 20 min, with a working distance of 10 mm to 1 m, and a substrate diameter of 5 to 300 mm;

or wherein the source material is Sc, the compound deposited on the substrate is predominantly $Sc_2O_3$, the laser light has a wavelength selected in the range of 515 to 1100 nm with an intensity in the range of 1 to 2000 W corresponding to a power density of 0.001 to 2 kW/mm$^2$ on the source surface, a process gas being a mixture of $O_2$ and $O_3$, with a reaction chamber pressure of $10-^{11}$ to 1 hPa, and a compound layer thickness selected in the range of 0 to 1 μm obtainable within a time period of 0 to 20 min, with a working distance of 10 mm to 1 m. and a substrate diameter of 5 to 300 mm;

or wherein the source material is Mo, the compound deposited on the substrate is predominantly $Mo_4O_{11}$ or $MoO_3$, the laser light has a wavelength selected in the range of 515 to 1100 nm with an intensity in the range of 1 to 2000 W corresponding to a power density of 0.001 to 2 kW/mm$^2$ on the source surface, a process gas being a mixture of $O_2$ and $O_3$, with a reaction chamber pressure of $10^{-11}$ to 1 hPa, and a compound layer thickness selected in the range of 0 to 4 μm obtainable within a time period of 0 to 30 min, with a working distance of 10 mm to 1 m, and a substrate diameter of 5 to 300 mm;

or wherein the source material is Zr, the compound deposited on the substrate is predominantly $ZrO_2$, the laser light has a wavelength selected in the range of 515 to 1100 nm with an intensity in the range of 1 to 2000 W corresponding to a power density of 0.001 to 2 $kW/mm^2$ on the source surface, a process gas being a mixture of $O_2$ and $O_3$, with a reaction chamber pressure of $10^{-11}$ to 1 hPa, and a compound layer thickness selected in the range of 0 to 1 μm obtainable within a time period of 0 to 100 min, with a working distance of 10 mm to 1 m, and a substrate diameter of 5 to 300 mm;

or wherein the source material is Hf, the compound deposited on the substrate is predominantly $HfO_2$, the laser light has a wavelength selected in the range of 515 to 1100 nm with an intensity in the range of 1 to 2000 W corresponding to a power density of 0.001 to 2 $kW/mm^2$ on the source surface, a process gas being a mixture of $O_2$ and $O_3$, with a reaction chamber pressure of $10^{-11}$ to 1 hPa, and a compound layer thickness selected in the range of 0 to 1 μm obtainable within a time period of 0 to 40min, with a working distance of 10 mm to 1 m. and a substrate diameter of 5 to 300 mm;

or wherein the source material is Al, the compound deposited on the substrate is predominantly $Al_2O_3$, the laser light has a wavelength selected in the range of 515 to 1100 nm with an intensity in the range of 1 to 2000 W corresponding to a power density of 0.001 to 2 $kW/mm^2$ on the source surface, a process gas being a mixture of $O_2$ and $O_3$, with a reaction chamber pressure of $10^{-11}$ to 1 hPa, a compound layer thickness selected in the range of 0 to 1 μm obtainable within a time period of 0 to 20 min, with a working distance of 10 mm to 1 m, and a substrate diameter of 5 to 300 mm.

2. A method according to claim 1, wherein the one or more sources are irradiated with laser light on a surface of the one or more sources directly facing the substrate.

3. A method according to claim 1, wherein the one or more sources are irradiated with continuous laser light.

4. A method according to claim 1, wherein the reaction chamber pressure is selected in the range of $10^{-12}$ to $10^1$ hPa.

5. A method according to claim 1, wherein the step of providing a reaction atmosphere comprises an evacuation of the process chamber to a first pressure and then introducing the process gas to obtain a second pressure, the reaction chamber pressure in the reaction chamber.

6. A method according to claim 5, wherein the first pressure is lower than the second pressure.

7. A method according to claim 5, wherein the second pressure is selected in the range of $10^{-6}$ to $10^1$ hPa.

8. A method according to claim 1, wherein a temperature of a shroud of the reaction chamber is temperature controlled to a temperature selected in the range of 77 K to 500 K.

9. A method according to claim 1, wherein the process gas is selected from the group consisting of oxygen (O), ozone (O3), plasma-activated oxygen (O), nitrogen (N), plasma-activated nitrogen (N), hydrogen (H), fluorine (F), chlorine (Cl), bromine (Br), iodine (I), phosphorus (P), sulfur(S), selenium (Se), mercury (Hg), $NH_3$, $N_2O$, $CH_4$ and combinations of the foregoing.

10. A method according to claim 1, wherein the source material is a material that is solid or liquid in the reaction atmosphere.

11. A method according to claim 1, wherein the source material is selected from the group consisting of Sc, Ti, V, Cr, Mn, Fe, Co, Ni, Cu, Zn, Zr, Nb, Mo, Ru, Hf, Al, Mg, Ca, Sr, Ba, Y, Rh, Ta, W, Re, Ir, Ga, In, Si, Ge, Sn, Eu, Ce, Pd, Ag, Pt, Au, alloys of the foregoing and combinations of the foregoing.

12. A method according to claim 1, wherein the laser light irradiating the one or more sources with laser light in order to sublimate and/or evaporate atoms and/or molecules of the source material is focused at the one or more sources with an intensity selected in the range of 1 to 2000 W for a spot size of 1 $mm^2$ and a distance between the one or more sources and the substrate selected in the range of 50 to 120 mm.

13. A method according to claim 1, wherein the laser light irradiating the one or more sources with laser light has a wavelength in the range of 100 nm to 20 μm.

14. A method according to claim 1, wherein the compound deposited on the substrate is an oxide.

15. A method according to claim 1, wherein the compound deposited on the substrate is a nitride.

16. A method according to claim 1, wherein the compound deposited on the substrate is a hydride, fluoride, chloride, bromide, iodide, phosphide, sulfide, selenide or mercury compound.

17. A method according to claim 1, wherein the step of irradiating the one or more sources with laser light at least melts the surface of the one or more sources.

18. A method according to claim 1, wherein the step of irradiating the one or more sources with laser light source surface facilitates the reaction with the process gas.

* * * * *